US010686445B2

(12) United States Patent
Zamburg et al.

(10) Patent No.: US 10,686,445 B2
(45) Date of Patent: Jun. 16, 2020

(54) CONTROL SYSTEM FOR A RECONFIGURABLE INTEGRATED CIRCUIT

(71) Applicants: Nokia of America Corporation, Murray Hill, NJ (US); Nokia Solutions and Networks Oy, Espoo (FI)

(72) Inventors: Evgeny Zamburg, Espoo (FI); Adriaan De Lind Van Wijngaarden, Murray Hill, NJ (US); Dusan Suvakovic, Murray Hill, NJ (US)

(73) Assignees: Nokia of America Corporation, Murray Hill, NJ (US); Nokia Solutions and Networks Oy, Espoo (FI)

( * ) Notice: Subject to any disclaimer, the term of this patent is extended or adjusted under 35 U.S.C. 154(b) by 0 days.

(21) Appl. No.: 16/467,395

(22) PCT Filed: Dec. 8, 2017

(86) PCT No.: PCT/US2017/065413
§ 371 (c)(1),
(2) Date: Jun. 6, 2019

(87) PCT Pub. No.: WO2018/107090
PCT Pub. Date: Jun. 14, 2018

(65) Prior Publication Data
US 2020/0067510 A1 Feb. 27, 2020

Related U.S. Application Data

(60) Provisional application No. 62/432,374, filed on Dec. 9, 2016.

(51) Int. Cl.
*H03K 19/17704* (2020.01)
*G11C 13/00* (2006.01)
(Continued)

(52) U.S. Cl.
CPC ... *H03K 19/17712* (2013.01); *G11C 13/0069* (2013.01); *H01R 29/00* (2013.01); *H03K 19/1776* (2013.01)

(58) Field of Classification Search
None
See application file for complete search history.

(56) References Cited

U.S. PATENT DOCUMENTS 4,972,470 A 11/1990 Farago
5,051,804 A 9/1991 Morse et al.
(Continued)

FOREIGN PATENT DOCUMENTS

WO 2015167438 A1 11/2015
WO 2018107090 A1 6/2018
WO 2018107101 A1 6/2018

*Primary Examiner* — Crystal L Hammond

(57) ABSTRACT

An electrical system comprising a circuit of reconfigurable electrical devices and a controller including a processor. The processor has a configuration examiner and a state modifier. The configuration examiner is configured to determine a configuration for the circuit of reconfigurable electrical devices based upon a connection input. The state modifier is configured to modify, based on the configuration, the circuit by changing a resistance state of the reconfigurable electrical devices. A controller for reconfigurable electrical devices and a method of controlling reconfigurable electrical devices of a circuit are also described.

19 Claims, 31 Drawing Sheets

(51) Int. Cl.
    *H01R 29/00*      (2006.01)
    *H03K 19/1776*    (2020.01)

(56) References Cited

U.S. PATENT DOCUMENTS

| | | | |
|---|---|---|---|
| 5,668,419 | A | 9/1997 | Oktay |
| 7,054,050 | B2 * | 5/2006 | Vincent .................. G02F 1/155 |
| | | | 359/268 |
| 7,787,278 | B2 * | 8/2010 | Bae ......................... G11C 11/56 |
| | | | 365/100 |
| 7,902,857 | B1 | 3/2011 | Pino |
| 8,947,909 | B1 * | 2/2015 | Sutardja ............. G11C 13/0002 |
| | | | 365/148 |
| 8,976,137 | B2 * | 3/2015 | Goo .................... G02F 1/13338 |
| | | | 345/173 |
| 2003/0142578 | A1 | 7/2003 | Hsu et al. |
| 2011/0199936 | A1 * | 8/2011 | Suvakovic .............. H04J 3/047 |
| | | | 370/254 |
| 2012/0126195 | A1 | 5/2012 | Ignatiev et al. |
| 2013/0181739 | A1 * | 7/2013 | Sakimura ........... G11C 13/0004 |
| | | | 326/38 |
| 2014/0159067 | A1 | 6/2014 | Sakariya et al. |
| 2016/0329900 | A1 | 11/2016 | Thiagarajan et al. |

* cited by examiner

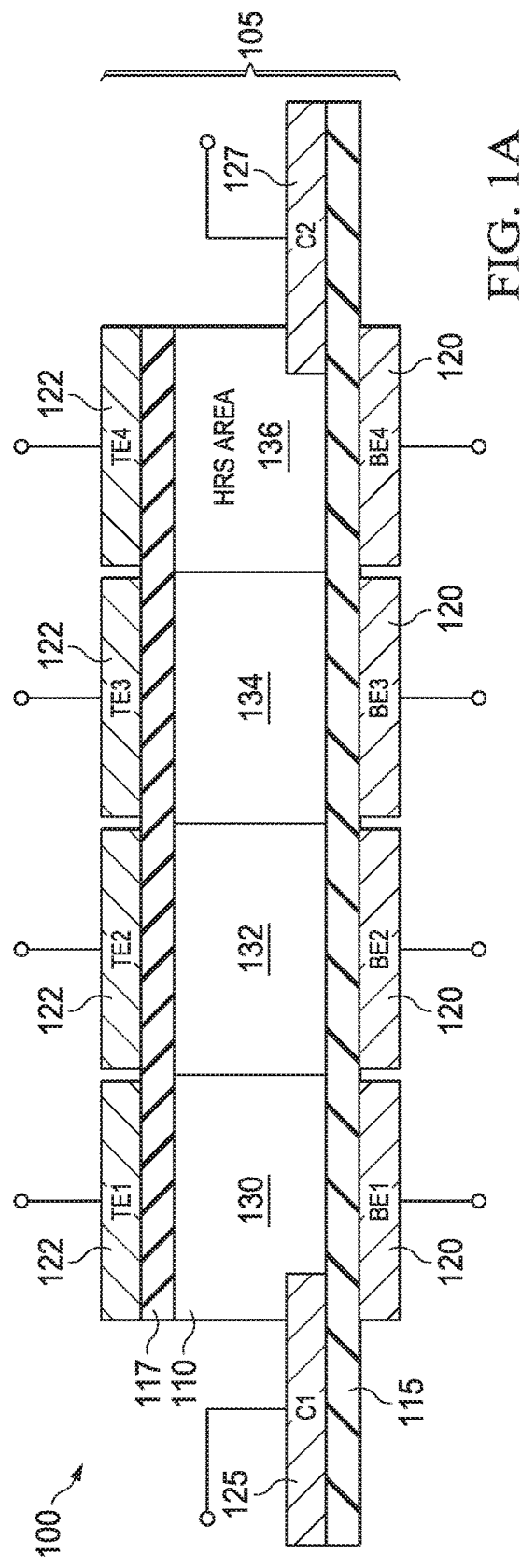
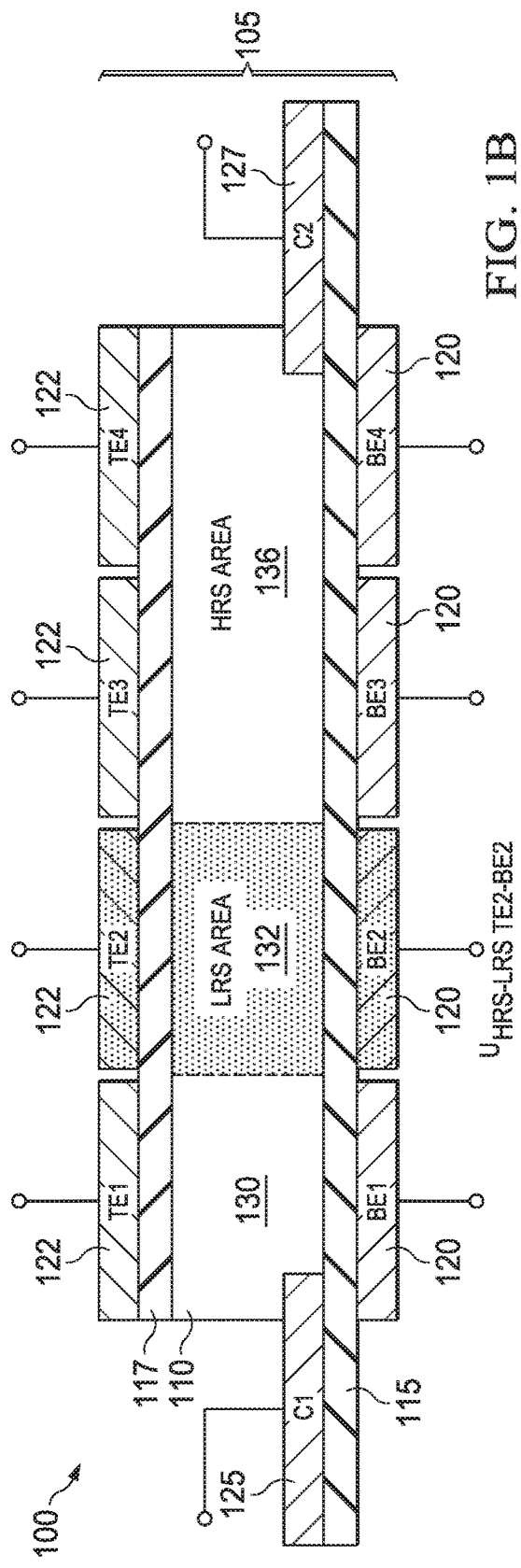
FIG. 1A
FIG. 1B

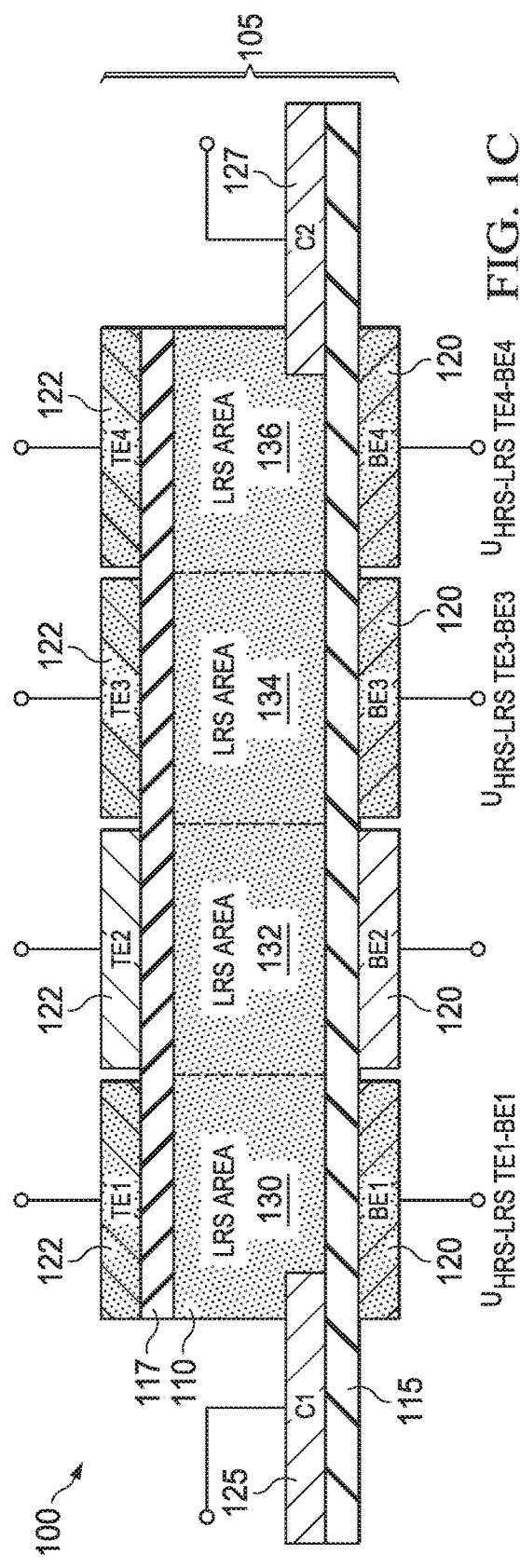
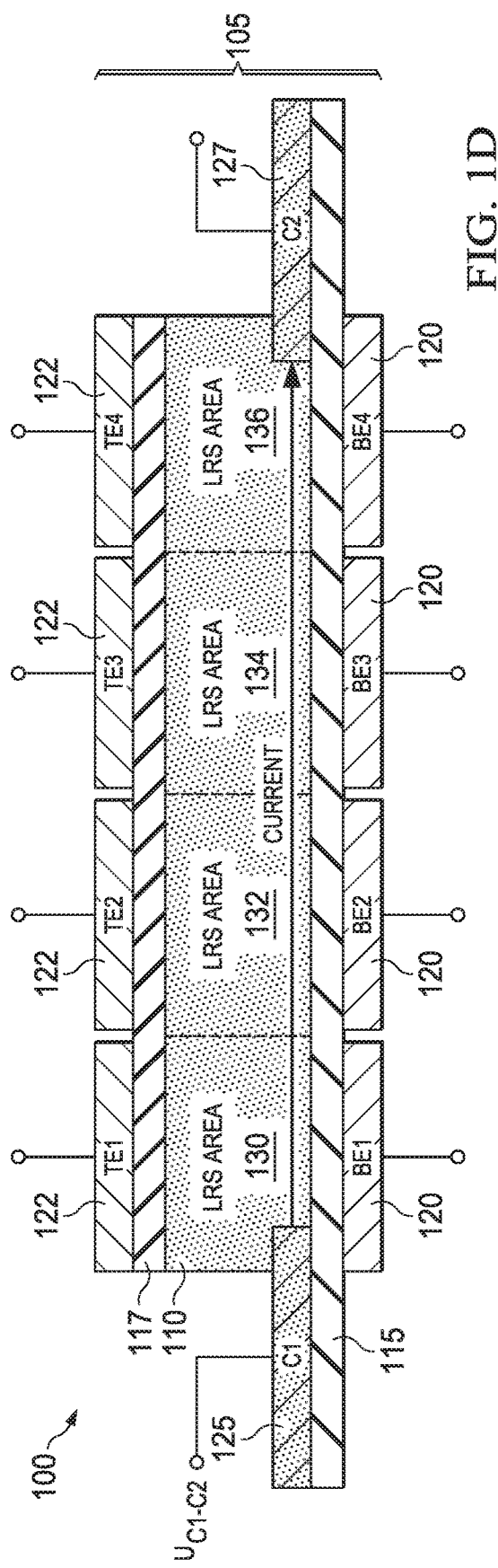

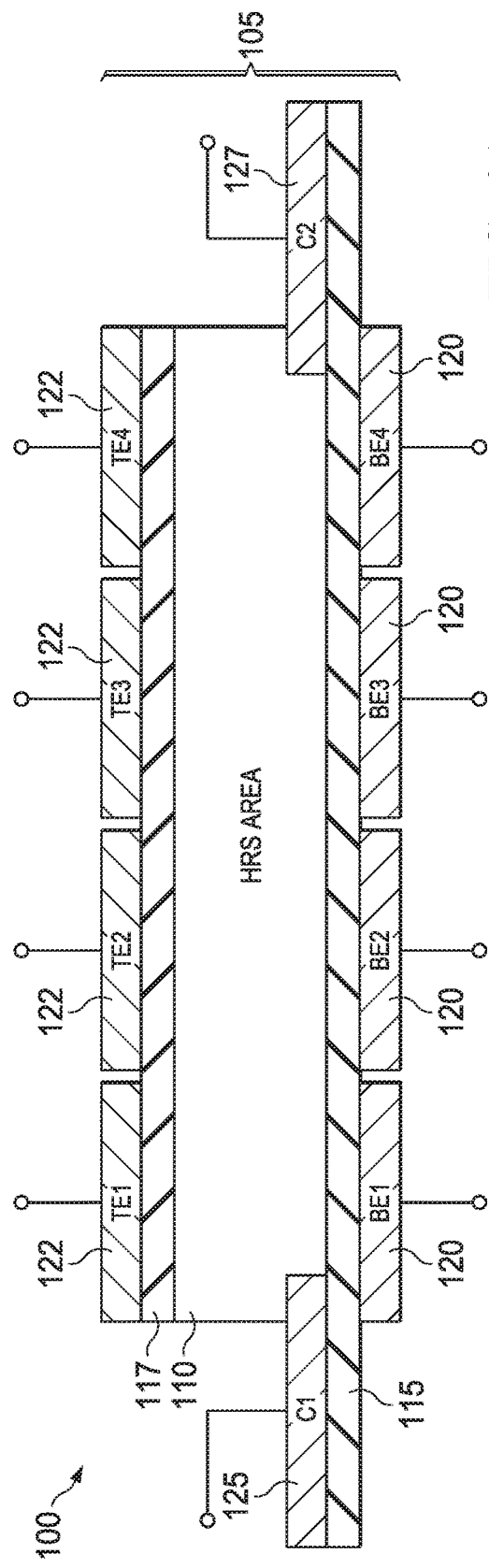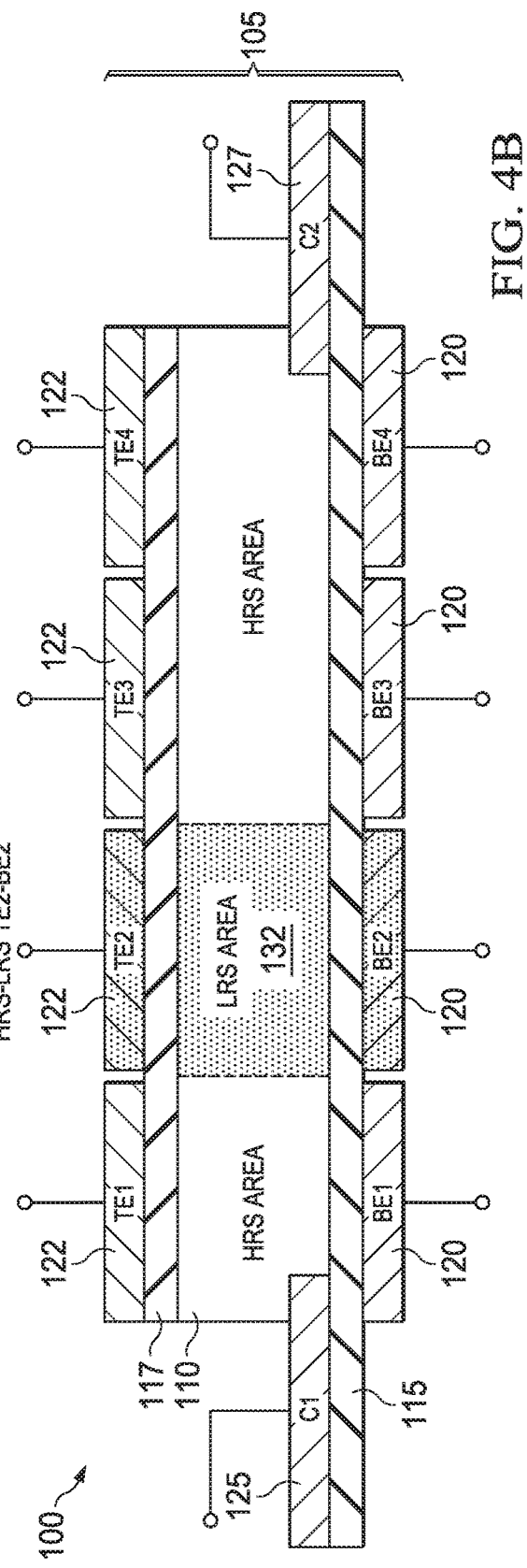

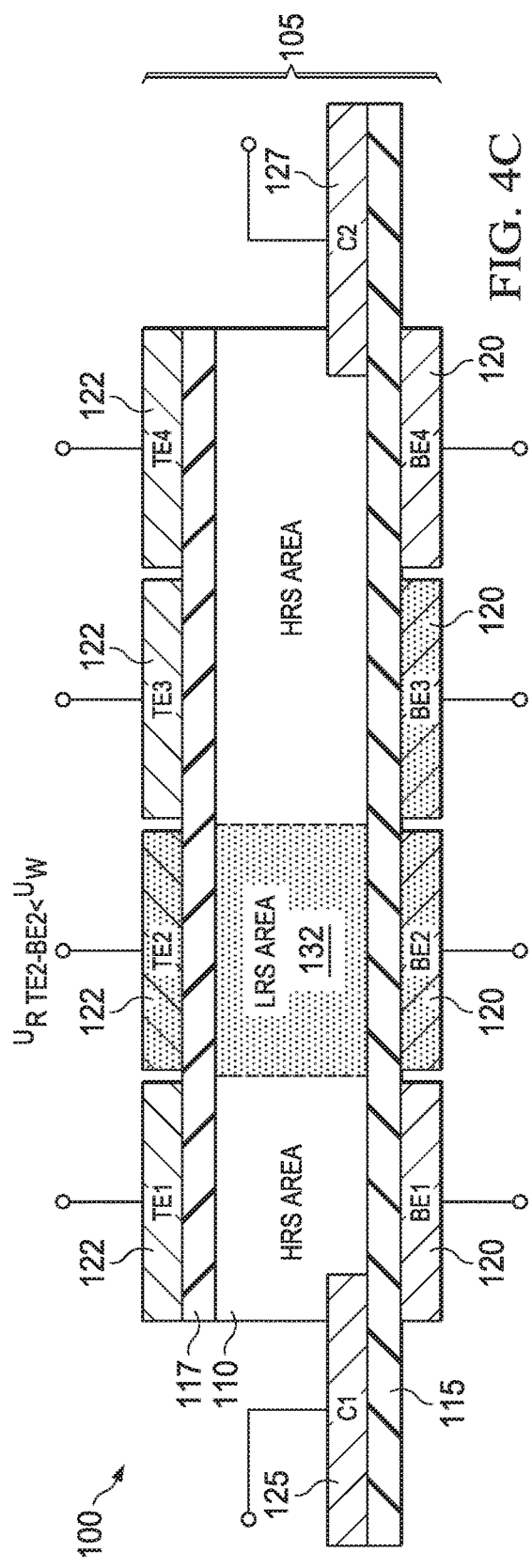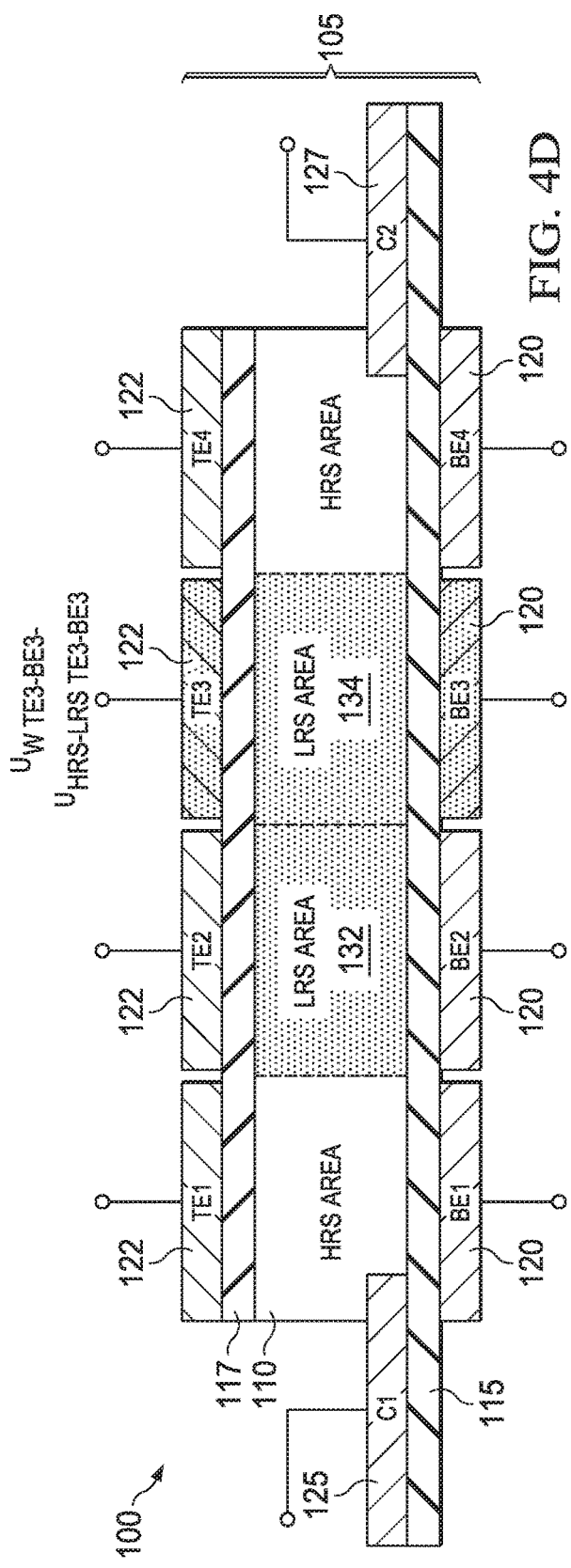

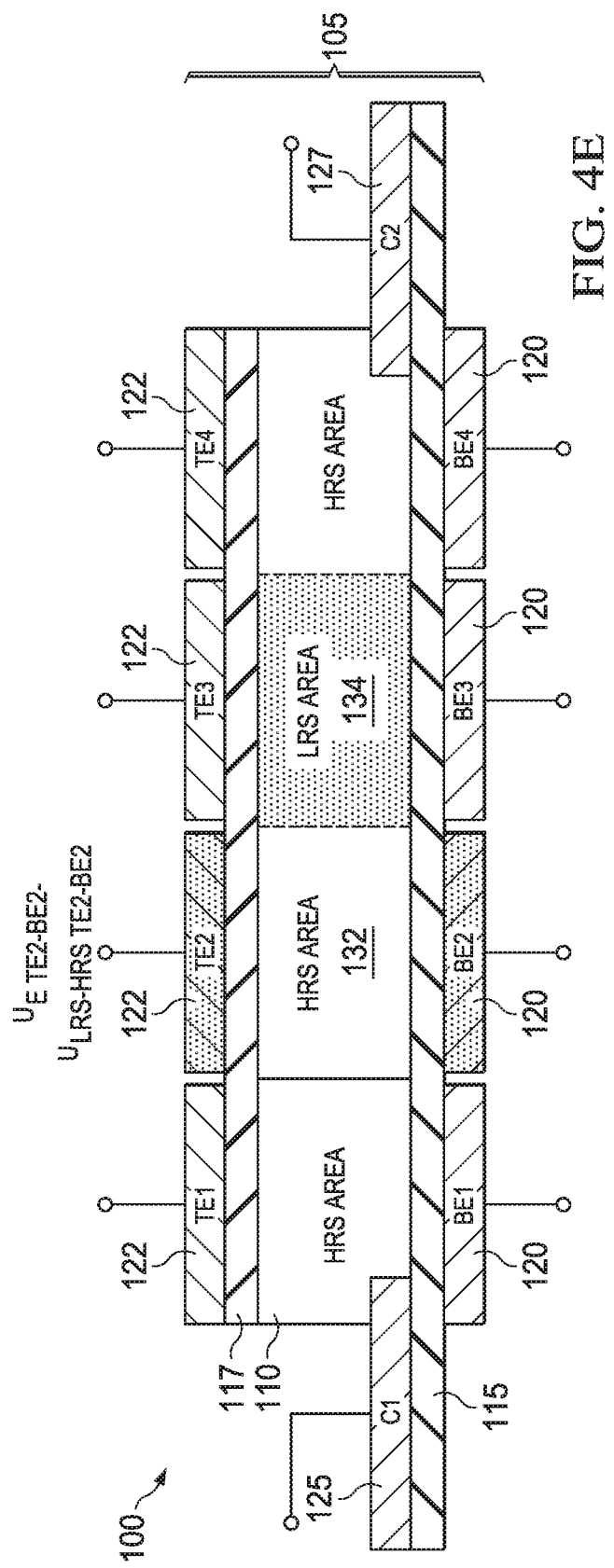

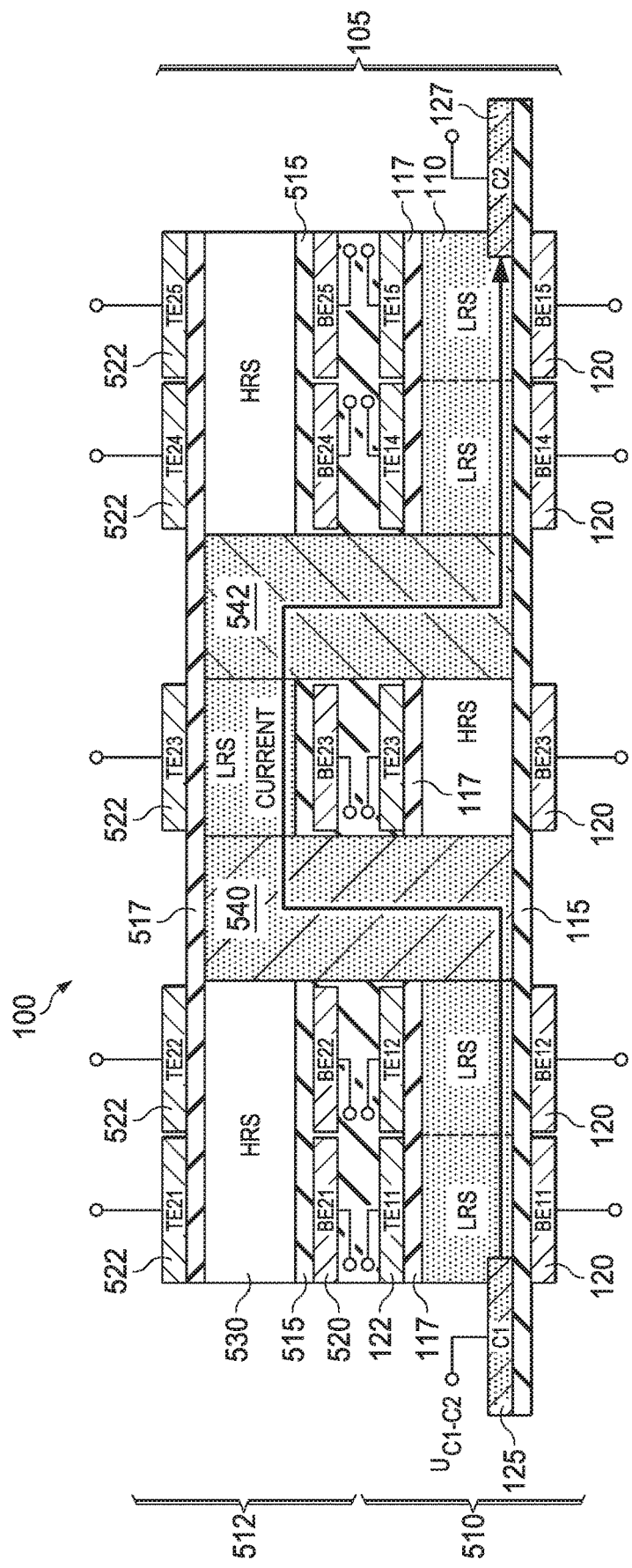
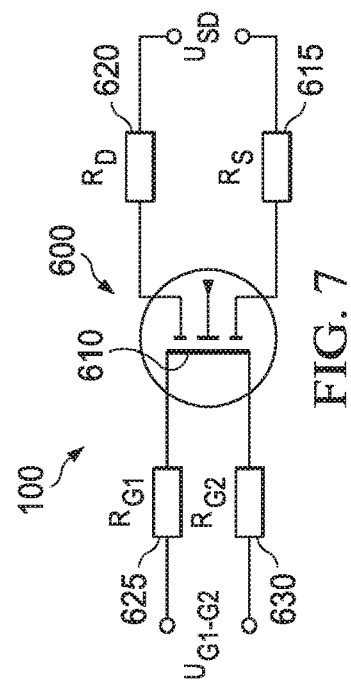
FIG. 5C
FIG. 7

A-A

B-B

C-C

D-D

D-D

D-D

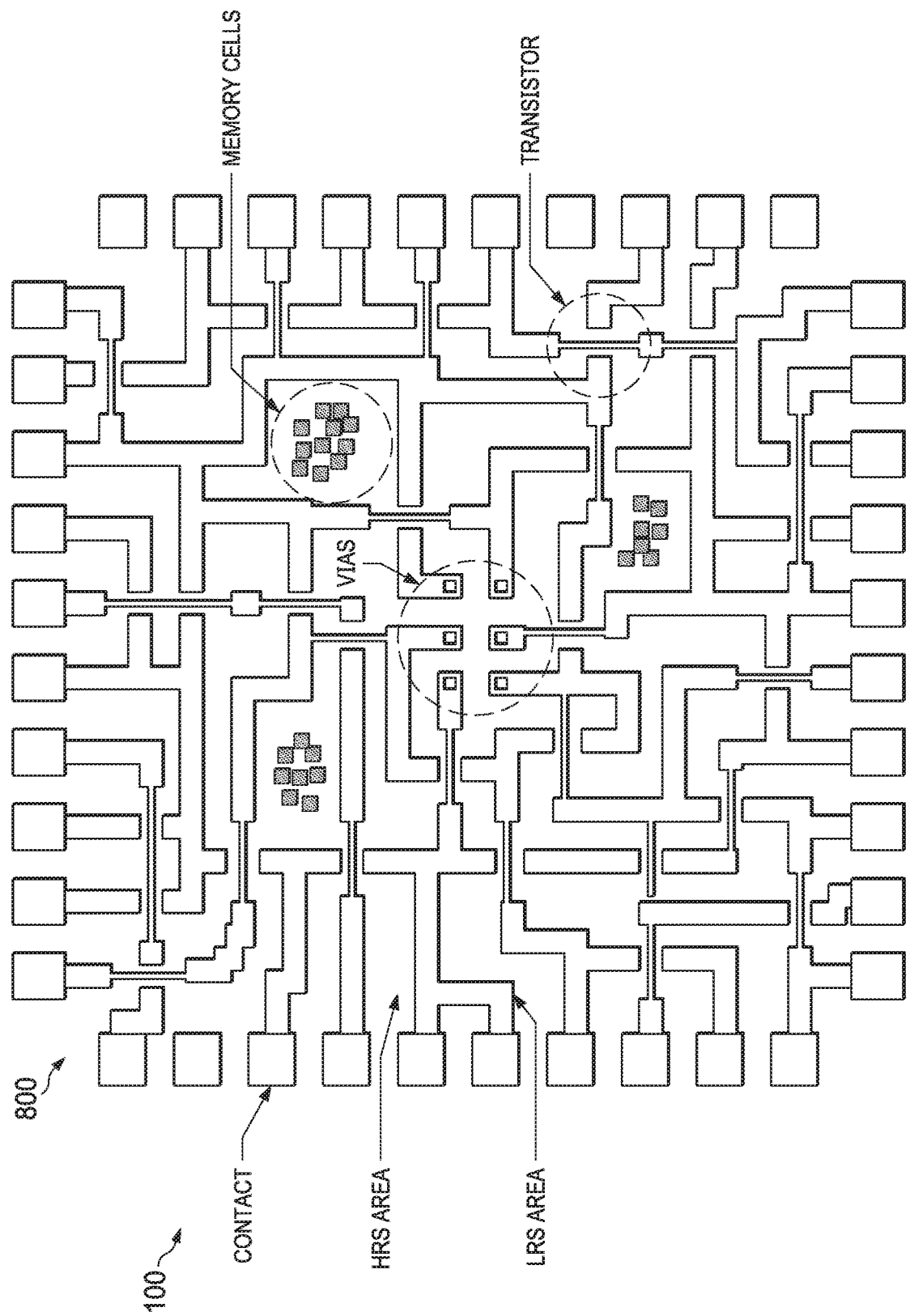

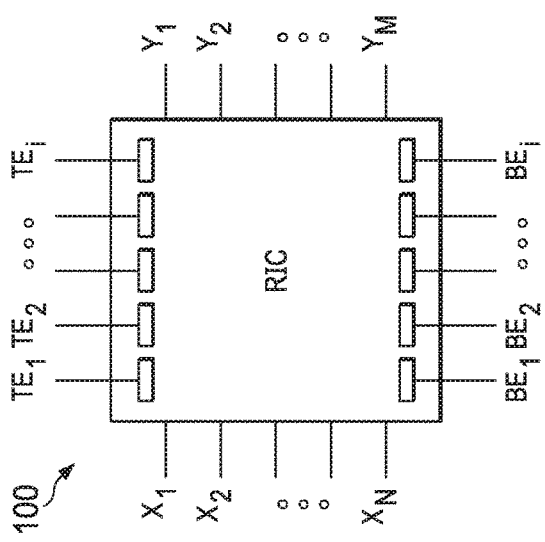
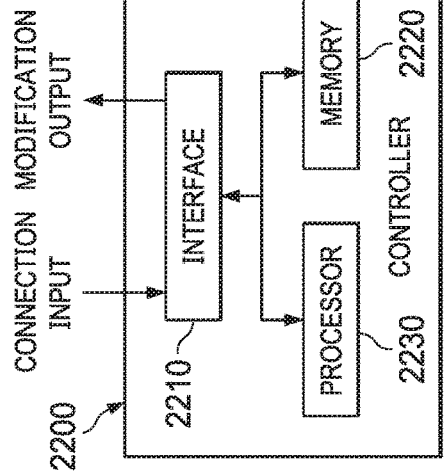
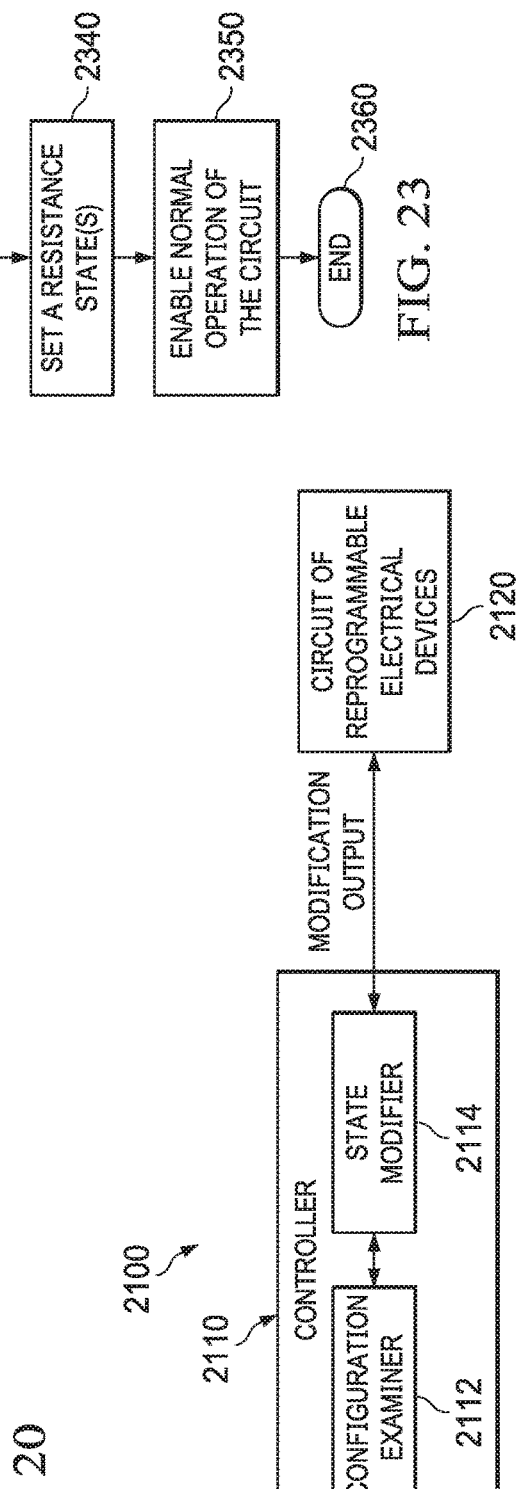
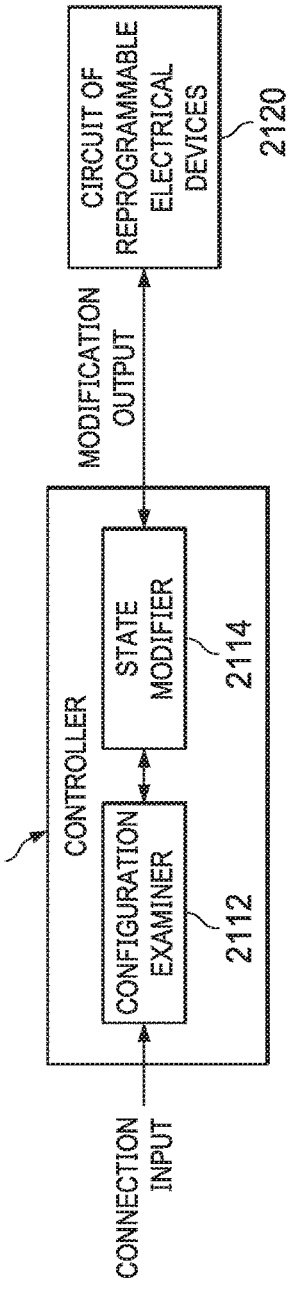

CONTROL SYSTEM FOR A RECONFIGURABLE INTEGRATED CIRCUIT

CROSS-REFERENCE TO RELATED APPLICATION

This application is the National Stage of, and therefore claims the benefit of, International Application No. PCT/US2017/065413 filed on Dec. 8, 2017, entitled "CONTROL SYSTEM FOR RECONFIGURABLE INTEGRATED CIRCUIT," which was published in English under International Publication Number WO 2018/107090 on Jun. 14, 2018, and further claims the benefit of U.S. Provisional Application No. 62/432,374 filed on Dec. 9, 2016. The above applications are commonly assigned with this National Stage application and are incorporated herein by reference in their entirety.

TECHNICAL FIELD

The disclosure relates, in general, to electrical devices and, more specifically but not exclusively, to controlling such devices.

BACKGROUND

This section introduces aspects that may help facilitate a better understanding of the disclosure. Accordingly, the statements of this section are to be read in this light and are not to be understood as admissions about what is prior art or what is not prior art.

Typically, an integrated circuit (IC) is designed for a specific purpose and the circuit itself cannot be changed after manufacturing. That is, the circuitry of the IC is "fixed" and it is not possible to redefine, or reconfigure, the circuit layout after manufacturing. Even ICs including programmable logic devices (PLD), uncommitted logic arrays (ULA), programmable logic arrays (PLA), memristors, resistive random-access memory (ReRAM), and similar devices, are typically reconfigurable only within a logical framework laid down by developers during manufacturing. While such devices can change interconnections between logical elements within the logical framework, the logical framework itself cannot be changed post-manufacturing.

SUMMARY

One embodiment of the disclosure is an electrical system that can comprise a circuit of reconfigurable electrical devices and a controller. The controller includes a processor having a configuration examiner and a state modifier. The configuration examiner is configured to determine a configuration for the circuit of reconfigurable electrical devices based upon a connection input. The state modifier is configured to modify, based on the determined configuration, the circuit by changing a resistance state of at least one electrical device of the reconfigurable electrical devices.

In some embodiments, the connection input can be derived from brain-like devices, intelligent systems or multi-purpose chips.

In some embodiments, the state modifier can be configured to change the resistance state of the reconfigurable electrical devices by applying a voltage to at least one paired top electrode and bottom electrode of the reconfigurable electrical devices, the at least one paired top electrode and bottom electrode being separated from each other by an active layer of the reconfigurable electrical devices.

In some embodiments, the state modifier can modify the circuit by providing a modification output applied at least one paired top electrode and bottom electrode of the reconfigurable electrical devices that includes a voltage level that changes the resistance state of the at least one paired top electrode and bottom electrode.

In some embodiments, the state modifier can modify the circuit by providing a modification output applied to at least to one paired top electrode and bottom electrode of the reconfigurable electrical devices that includes a disabling signal that disables normal operation of at least one of the reconfigurable electrical devices. In some such embodiments, the disabling signal interrupts an operating voltage applied to the circuit.

In some embodiments, the state modifier can modify the circuit by providing a modification output applied to at least one paired top electrode and bottom electrode of the reconfigurable electrical devices that includes an enabling signal that enables operation of the at least one paired top electrode and bottom electrode. In some such embodiments, the enabling signal applies an operating voltage applied to at least one paired top electrode and bottom electrode of the reconfigurable electrical devices.

Another embodiment of the disclosure is a controller for reconfigurable electrical devices that can comprise an interface configured to receive configuration information and a processor. The processor can be configured to determine a circuit configuration for a circuit of the reconfigurable electrical devices and modify the circuit by changing a resistance state of at least one electrical device of the reconfigurable electrical devices based on the determined configuration.

In some embodiments, the configuration information can include connection input to define electrical conductive paths in the circuit corresponding to a logic function.

Some embodiments of the controller can further including a memory configured to store operating instructions with the configuration information to direct the operation of the processor. In some such embodiments, the memory or at least a portion thereof can be a non-volatile memory. In some such embodiments, the memory can be part of the processor. In some such embodiments, the operating instructions can include one or more algorithms to implement a method. In some such embodiments, the method can include receiving from the memory of the controller the configuration for the circuit. The method can include sending a disabling signal to at least one of the reconfigurable electrical devices to disable an operating state of the reconfigurable electrical device. The method can include sending a setting signal to the at least one of the reconfigurable electrical device to set the resistance state of the reconfigurable electrical device. The method can include sending an enabling signal to the reconfigurable electrical device to enable the operating state of the reconfigurable electrical device with the resistance state from the setting signal.

In some embodiments, the processor can be configured to modify a portion of the circuit while a remaining portion of the circuit is in a normal operating state.

In some embodiments, the processor can be configured to fully modify the circuit while the circuit is in a non-operating reconfiguration state.

Another embodiment of the disclosure is method of controlling reconfigurable electrical devices of a circuit. The method can include sending a disabling signal to at least one of the reconfigurable electrical devices to disable an operating state of the reconfigurable electrical device. The method can include sending a setting signal to the at least one reconfigurable electrical device to set a resistance state of the reconfigurable electrical device. The method can include sending an enabling signal to the at least one reconfigurable electrical device to enable the operating state of the reconfigurable electrical device with the resistance state from the setting signal.

In some embodiments, the enabling signal can cause the application of a designated voltage level to a pair or pairs of electrodes to set the resistance state of the at least one reconfigurable electrical device.

In some embodiments, setting the resistance state of a plurality of the reconfigurable electrical devices can be set by reversibly changing a local area of an active layer of the plurality of reconfigurable electrical devices between insulating and conducting by applying a voltage between one or more pairs of top and bottom electrodes of the plurality of the reconfigurable electrical devices that are associated with the local area.

BRIEF DESCRIPTION OF THE DRAWINGS

The embodiments of the disclosure are best understood from the following detailed description, when read with the accompanying FIGS. Some features in the figures may be described as, for example, "top," "bottom," "vertical" or "lateral" for convenience in referring to those features. Such descriptions do not limit the orientation of such features with respect to the natural horizon or gravity. Various features may not be drawn to scale and may be arbitrarily increased or reduced in size for clarity of discussion. Reference is now made to the following descriptions taken in conjunction with the accompanying drawings, in which:

FIG. 1A presents a cross-sectional view of an example electrical device that includes an embodiment of a reconfigurable integrated circuit of the present disclosure, with no voltage being applied between pairs of top and bottom electrodes (e.g., TE1 and BE1, TE2 and BE2, etc. . . . ) separated by an active film layer in a high resistance state (HRS area);

FIG. 1B presents the same view of the example electrical device as shown in FIG. 1A, after applying a voltage (e.g., $U_{HRS-LHS}$) between one pair of top and bottom electrodes (e.g., TE2 and BE2, respectively) to form a low resistance state in one area portion (LRS area) of the active film layer of the device;

FIG. 1C presents the same view of the example electrical device as shown in FIG. 1B, after applying a voltage (e.g., $U_{HRS-HS}$) between multiple pairs of top and bottom pairs of electrodes (e.g., TE1 and BE1, TE3 and BE3, and TE4 and BE4) to form a low resistance state in multiple area portions (LRS area) of the active film layer of the device;

FIG. 1D presents the same view of the example electrical device as shown in FIG. 1C and further shows a current passing through the portions of the active film layer in the low resistance state from a first contact layer (C1) to a second contact layer (C2);

FIG. 2A' presents a semitransparent plan top view of the example electrical device depicted in FIG. 2A;

FIG. 4A presents a cross-sectional view of an example electrical device analogous to that shown in FIG. 1A, with no voltage applied between pairs of top and bottom electrodes separated by an active film layer in a high resistance state (HRS area);

FIG. 4B presents the same view of the example electrical device as shown in FIG. 4A, after a voltage, $U_{W\ TE2-BE2}$, is applied between a pair of top and bottom electrodes separated by the active film layer to form a low resistance state in one area portion (LRS area) or cell of the active film layer to write of an information bit to the cell;

FIG. 4C presents the same view of the example electrical device as shown in FIG. 4B, with the resistance state of the cell being read, e.g., by using a lower voltage $U_{R\ TE2-BE2}$ to read the state of resistivity of the cell;

FIG. 4D presents the same view of the example electrical device as shown in FIG. 4C, after the low resistance state of the cell, is written to another cell, e.g., by applying a voltage, $U_{W\ TE3-BE3}$, between another pair of top and bottom electrodes separated by another area portion of the active film layer to form a same low resistance state in the other area portion (second LRS area) corresponding to the other cell;

FIG. 4E presents the same view of the example electrical device as shown in FIG. 4D, after the low resistance state of the cell is erased, e.g., by applying a voltage, $U_{E\ TE2-BE2}$, between the pair of top and bottom electrodes separated by the area portion of the active film layer;

FIG. 5C presents the same view of the example electrical device as shown in FIG. 5B and further showing a current passing through the portions of the active film layers in the low resistance state from a first contact layer (C1) to a second contact layer (C2);

FIG. 7 presents an electric circuit diagram that is electrically equivalent to the transistor structure depicted in FIGS. 6A-6C;

FIG. 19 presents a plan top view of an example reconfigurable integrated circuit similar to that depicted in FIG. 11, shown another example IC layout having memory cells, vias and transistor elements;

FIG. 20 presents an electrical circuit block diagram that is electrically equivalent to the example IC layouts of the reconfigurable IC such as depicted in FIGS. 12-19;

FIG. 21 illustrates a block diagram of an embodiment of a reconfigurable electrical system constructed according to the principles of the disclosure;

FIG. 22 illustrates a block diagram of an embodiment of a controller for reconfigurable electrical devices constructed according to the principles of the disclosure; and FIG. 23 illustrates a flow diagram of an embodiment of a method of controlling reconfigurable electrical devices carried out according to the principles of the disclosure.

In the Figures and text, similar or like reference symbols indicate elements with similar or the same functions and/or structures.

Figure 1E:
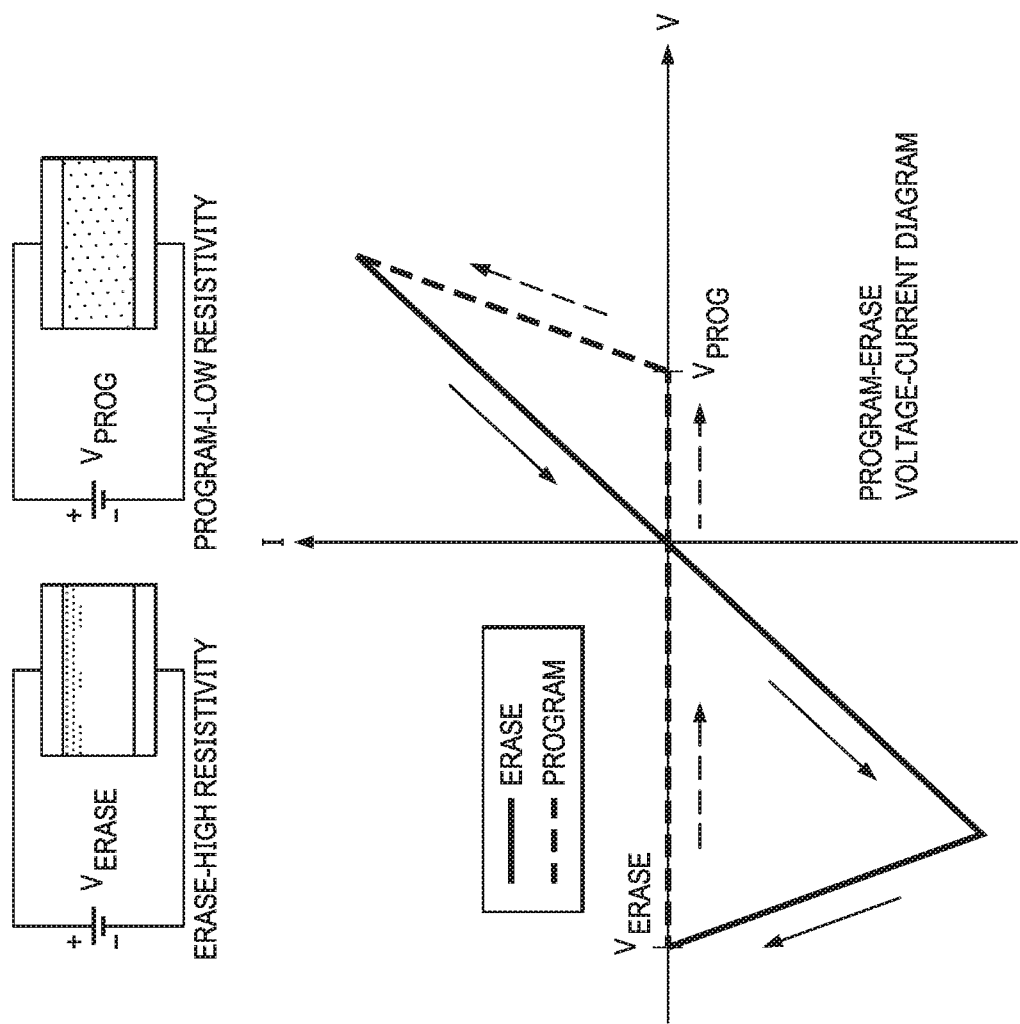
FIG. 1E presents a diagram to illustrate example programming and erase operations of an example single cell.

In the Figures, the relative dimensions of some features may be exaggerated to more clearly illustrate one or more of the structures or features therein.

Herein, various embodiments are described more fully by the Figures and the Detailed Description. Nevertheless, the inventions may be embodied in various forms and are not limited to the embodiments described in the Figures and Detailed Description of Illustrative Embodiments.

DETAILED DESCRIPTION

The description and drawings merely illustrate the principles of the inventions. It will thus be appreciated that those skilled in the art will be able to devise various arrangements that, although not explicitly described or shown herein, embody the principles of the inventions and are included within its scope. Furthermore, all examples recited herein are principally intended expressly to be for pedagogical purposes to aid the reader in understanding the principles of the inventions and concepts contributed by the inventor(s) to furthering the art, and are to be construed as being without limitation to such specifically recited examples and conditions. Moreover, all statements herein reciting principles, aspects, and embodiments of the inventions, as well as specific examples thereof, are intended to encompass equivalents thereof. Additionally, the term, "or," as used herein, refers to a non-exclusive or, unless otherwise indicated. Also, the various embodiments described herein are not necessarily mutually exclusive, as some embodiments can be combined with one or more other embodiments to form new embodiments.

As mentioned above, integrated circuits are currently "fixed" after manufacturing. This disclosure provides a way to "redraw" circuitry after manufacturing by providing a fully reconfigurable electronic circuit, after manufacturing, that can be reconfigured (or at least parts thereof) "instantly" during normal operation or during a well-defined reconfiguration stage. Current integrated circuit technologies do not have this capability. As such, the disclosure provides a controller, control system, and method of controlling a meta-material-based reconfigurable integrated circuit that can be instantly programmable and provides full flexibility. Accordingly, the features disclosed herein can be used in integrated circuits that are suitable for the development of, for example, brain-like devices, intelligent systems, and multi-purpose chips.

The proposed reconfigurable integrated circuit uses a thin film of a material having several states of resistivity that can be changed by applying a given one of a set of voltage levels between a respective pair of top and bottom electrodes. Maintaining the state of resistivity is non-volatile. Each "circuit reconfiguration" is performed by applying a given voltage to pairs of electrodes that control the resistivity of a well-defined area (cell). A control system or controller is used to control pairs of electrodes, such as a two-dimensional array of pairs, per active layer to independently set the states of the cells of the active layer to a certain resistivity. In one embodiment, the controller loads a new configuration. The new circuit configuration can be determined based on a connection input or can be received as in input. A connection input can be a desired connection result for a reconfigurable circuit. For example, a computer program or a computing device may provide an output that indicates a desired functionality or result from a reconfigurable circuit. In some embodiments, the controller can receive this output and determine the configuration needed to achieve it, i.e., what electrical conductive paths are needed between what contacts. The truth tables discussed below and the corresponding FIGS. 13-18 are an example of a desired result and the conductive paths formed through reconfiguration to provide the desired result.

In a next stage, the controller disables normal operation of the part or portion that is being reconfigured. The controller then can set cells of an active layer in the desired resistance state corresponding to the new circuit layout. In a last stage, the controller can enable (e.g., enable by re-enabling) operation with the new circuit in place. The control system can operate in a parallel, or a group-wise parallel fashion.

The unique benefits of the disclosed features include the ability to form an arbitrary electronic circuit by using an array of top and bottom electrodes to adjust the resistivity of given areas of an active layer, the ability to "erase" (part of) the integrated circuit, and to replace it by another arbitrary electronic circuit, as such achieving full reconfigurability and flexibility of functionality.

The disclosure provides a controller that reconfigures, after manufacturing, a circuit for reconfigurable electronic devices. The controller can fully or partially reconfigure the circuit of the reconfigurable electronic device. The controller may rapidly perform the reconfiguration during normal operation or perform the reconfiguration during a well-defined reconfiguration stage. The controller provides broad design flexibility for the reconfigurable electronic devices and enables the reconfigurable circuits to be used in the development of such devices as brain-like devices, intelligent systems, and multi-purpose chips.

As disclosed herein the controller can reconfigure the circuit of the reconfigurable electronic devices by changing the resistivity of one or more cells of an active layer. In one embodiment, the controller applies different voltage levels to a respective pair of top and bottom electrodes of a cell to reconfigure a circuit. The appropriate voltage levels can be determined or developed via, for example, historical analysis or trial and error. The appropriate voltage levels may vary depending on the application and configuration of the reconfigurable electrical circuits. Each cell of an active layer (e.g., thin film layers comprising memristive materials or meta-materials) has two or more states of resistivity that are changed by applying a designated voltage level. Maintaining the state of resistivity is non-volatile. Each pair of electrodes controls the resistivity of a defined area portions, or cells, of the active layer. In some embodiments one-, two- or three-dimensional arrays of pairs of electrodes are used to independently set the cells to certain resistivity states. Setting neighboring cells to a low resistance state can establish conductivity across these neighboring cells. Voltage applied across connected cells that are programmed to be in a low-resistance state allows a laterally or vertically connected set of low-resistance areas to carry signals. This effect can also be used for controlling electrical properties in a channel between gates in transistor structures. As such, persistent structures can be used to create connections, transistors, memory cells or other kinds of circuitry.

The circuit layout structure of the reconfigurable integrated circuit can be erased by changing the resistivity of the cells having a low resistance state to a high resistance state by applying a certain voltage between corresponding pairs of top and bottom electrodes. Reconfiguration of the integrated circuit layout can occur by erasing part of the IC layout, and creating new elements and interconnections in a different IC layout. In some embodiments, as disclosed herein, it is possible to create any number of different integrated circuit lay-outs and then transform layout depending on relevance to the real-time tasks.

As noted above, each "circuit reconfiguration" can be performed by applying a given voltage (a particular voltage level or value) to pairs of electrodes that control the resistivity of a well-defined area (cell). A control system, controller, or method of controlling as disclosed herein is used to control pairs of electrodes per active layer to independently set the states of the cells to a certain resistivity.

Embodiments of the disclosed reconfigurable integrated circuit and controller are thought to provide several advantages: 1) Run-time reconfiguration. 2) Possibility of changing not only interconnections between elements, but also the structure of logical elements. 3) The entire area of the active layer or layers can be used when forming the elements. This is unlike some traditional approaches related to using a number of "fixed" individual elements that are connected by configurable "fixed" interconnection network to form a given ("reconfigurable") integrated circuit. 4) Circuit elements can be placed anywhere in the active film layer, because, e.g., the circuit element does not require having special doped areas. 5) Device embodiments make it possible to create and reconfigure many different kinds of integrated circuit layouts as part of a same integrated circuit device.

Various aspects of the disclosed reconfigurable integrated circuit and its operation are illustrated in various example embodiments disclosed herein. The operating principle of the disclosed electrical devices is related to the use of cells (like pixels) in a uniform layer (e.g., thin film layer or layers) of an active material having electrical properties (e.g., different resistivity states) depending on the voltage between the top and bottom electrodes. The control features provided herein can apply a voltage (e.g., $U_{HRS\text{-}LRS}$) between a pair of top and bottom electrodes associated with one cell corresponding to an area portion of the active film layer or layers, the local resistivity of the cell can be switched between a high-resistance state (HRS) and a low resistance state (LRS).

Aspects of a control system, controller, and a method of controlling are illustrated in FIGS. 21, 22, and 23. Aspects of the structure and operation of electrical devices having a reconfigurable integrated circuit in which can be controlled by the control system, controller, or method are provided and discussed in FIGS. 1A-20.

Turning now to FIG. 21, a block diagram is illustrated of an embodiment of a reconfigurable electrical system 2100 constructed according to the principles of the disclosure. The reconfigurable electrical system 2100 includes a controller 2110 and a circuit of reconfigurable electrical devices 2120. The controller 2110 and the circuit of reconfigurable electrical devices 2120 can be coupled via conventional means. The reconfigurable electrical devices 2120 can be a circuit of the various embodiments of reconfigurable integrated circuits disclosed herein. The controller 2110 includes a configuration examiner 2112 and a state modifier 2114. The controller 2110 or a portion thereof can be implemented on a processor. In some embodiments, the controller 2110 can be implemented as hardware, software, or a combination thereof.

The configuration examiner 2112 is configured to receive a connection input (e.g., an input that defines connections to be created on the circuit by changing the resistivity of portions of the active layer) and determine a configuration for the circuit of reconfigurable electrical devices based thereon. The connection input can be received via a computing device associated with, for example, brain-like devices or intelligent systems. The configuration examiner 2112 can provide the configuration to the state modifier 2114 via a conventional means.

The state modifier 2114 is configured to receive the configuration (or new configuration) and modify the circuit 2120 by changing a resistance state of the reconfigurable electrical devices, or at least one thereof, based on the configuration. The state modifier 2114 can change the resistance state by applying a voltage to at least one paired top and bottom electrodes of the reprogrammable electrical devices, wherein the reconfigurable electrical devices include paired top electrodes and bottom electrodes separated from each other by an active layer. In one embodiment, the state modifier 2114 provides a modification output to modify the circuit 2120. The modification output can include a disabling signal that disables normal operation of at least one of the reconfigurable electrical devices, a voltage level that changes the resistance state of the at least one, and an enabling signal that enables (e.g., re-enables) operation of the at least one. In one embodiment, the disabling signal may interrupt an operating voltage that is applied to the circuit 2120 and the enabling signal can reapply the operating voltage to resume normal operation.

FIG. 22 illustrates a block diagram of an embodiment of a controller 2200 for reconfigurable electrical devices constructed according to the principles of the disclosure. The controller 2200 includes an interface 2210, a memory 2220 and a processor 2230 that can be connected together via conventional means. The controller 2200 can be, for example, the controller 2110 of FIG. 1.

The interface 2210 is configured to receive configuration (or reconfiguration) information, such as connection input. The interface 2210 is also configured to transmit configuration (or reconfiguration) information, such as modification output. The interface 2210 can be a conventional interface that is used to receive and transmit data. The interface 2210 can include multiple ports, terminals or connectors for receiving or transmitting the data. The ports, terminals or connectors may be conventional receptacles for communicating data via a communications network.

The memory 2220 may be a conventional memory that is constructed to store data and computer programs. The memory 2220 may store operating instructions to direct the operation of the processor 2230 when initiated thereby. The operating instructions may correspond to algorithms that provide the functionality of the control operating schemes disclosed herein. For example, the operating instructions may correspond to the algorithm or algorithms that correspond to the method of FIG. 23. In one embodiment, the memory 2220 or at least a portion thereof is a non-volatile memory. The operating instructions can be a computer program product.

The processor 2230 is configured to determine a circuit configuration for a circuit of reconfigurable electrical devices and modify the circuit by changing a resistance state of the reconfigurable electrical devices based on the configuration. In one embodiment, the memory 2220 or a portion thereof can be part of the processor 2230.

FIG. 23 illustrates a flow diagram of an embodiment of a method 2300 of controlling reconfigurable electrical devices of a circuit are carried out according to the principles of the disclosure. The method 2300 can be carried out by a controller or control system disclosed herein. The method 2300 begins in a step 2310. The method is not limited to the steps described herein.

In a step 2320, a configuration for a circuit is received. The configuration can be a predetermined configuration that is loaded from memory. For example, multiple predetermined or previously determined configurations can be stored in a memory and loaded to reconfigure a circuit. Thus, previously used configurations can be used for reconfiguration again in addition to configurations that have not been previously employed. The configuration can be determined by the controller based on connection input.

In a step 2330, a normal operation of reconfigurable electrical devices of the circuit to be reconfigured is disabled based on the configuration. A disabling signal may be employed to cause the disablement.

In a step 2340, a resistance state of the reconfigurable electrical devices is set corresponding to the configuration. The controller can apply designated voltage levels to a pair or pairs of electrodes to set the desired resistance states. As discussed herein, the resistance states correspond to conductivity.

In a step 2350, normal operation of the reconfigurable electrical devices is enabled after the setting of the resistance states. The controller can send an enabling signal to cause the enablement. The method 2300 ends in step 2360. Advantageously, the method 2300 can be repeated again post-manufacturing to reconfigure circuits as needed or desired.

Aspects of the structure and operation of an embodiment of an electrical device having a reconfigurable integrated circuit, in which the control schemes disclosed herein can be used with, are illustrated in FIGS. 1A-1D.

FIG. 1A presents a cross-sectional view of an example electrical device 100 that includes an embodiment of a reconfigurable integrated circuit 105 of the present disclosure. FIG. 1A shows the reconfigurable integrated circuit 105 with no voltage being applied between pairs of top and bottom electrodes (e.g., TE1 and BE1, TE2 and BE2, etc. . . . ) separated by an active layer in a high resistance state (HRS area).

As illustrated, an active layer (e.g., layer 110) is positioned between a bottom and a top insulator layer (e.g., insulating layers 115, 117), and pairs of bottom and top electrodes (e.g., bottom electrode 120 and top electrode 122) are located on the respective insulating layers. Electrical contacts (e.g., contacts, C1, C2, 125, 127) are located on at least one of the insulating layers (e.g., bottom insulator layer 115) and touching different portions of the active layer.

FIG. 1A shows the reconfigurable integrated circuit 105 with four configured cells (e.g., cells 130, 132, 134, 136) and two contact points 125, 127. The cells can be used as elementary areas for configuring or reconfiguring circuitry. The resistivity of the film area associated with a cell can be modified by applying a given voltage between a pair of top and bottom electrodes associated with that cell. For example, by applying voltage $U_{LRS\text{-}HRS}$ between a pair of top and bottom electrodes associated with one cell, the corresponding area can be switched from a low resistive state (LRS) to a high resistive state (HRS), thus erasing a conductive channel that the cell is a part of. For some embodiments, a cell's resistive state can be non-volatile, and as such, the resistive state is maintained during normal operation and after power resets.

FIG. 1B shows the example electrical device after applying a voltage (e.g., $U_{HRS\text{-}HS}$) between one pair of top and bottom electrodes 122, 120 (e.g., TE2 and BE2, respectively) to form a low resistance state in one area portion (e.g., LRS area corresponding to cell 132) of the active film layer 110 of the device 100 while other areas (e.g., other cells) are not affected and remain in the high-resistivity state.

FIG. 1C shows the example electrical device 100 after applying a voltage (e.g., $U_{HRS\text{-}LHS}$) between multiple pairs of top and bottom pairs of electrodes (e.g., TE1 and BE1, TE2 and BE2, TE3 and BE3, and TE4 and BE4) to form a low resistance state in multiple area portions (multiple LRS areas corresponding to all four cells 130 . . . 134)) of the active film layer 110 of the device 100. As a result, a connection between the two contacts 125, 127 of the circuit can be established via the four cells configured in the LRS. No voltage needs to be applied once the low resistance state has been formed.

For instance, FIG. 1D presents the same view of the example electrical device as shown in FIG. 1C and shows a current passing through the portions of the active film layer 110 in the low resistance state from a first contact layer 125 (C1) to a second contact layer 127 (C2). One skilled in the pertinent arts would understand that embodiments of the contact layer are electrical contacts and may be metallic connections, used to apply input signals or from which to observe output signals.

FIG. 1E presents a diagram to illustrate example programming and erase operations of an example single cell, e.g., a redox-based memristive effect in a metal oxide film. The resistivity of a cell can be changed by applying different voltages between the top and bottom electrodes that are associated with the cell. By applying $V_{prog}$, oxygen vacancies, represented in the figure as black dots, move inside the redox-based memristive material, thus switching the cell to a low resistivity state, e.g., in about 50 ns. If a negative voltage $V_{erase}$ is applied, the oxygen vacancies will move to the top electrode, as such switching the cell to a high resistivity state. A cell retains its resistivity state when no voltage is applied.

Figure 2A:
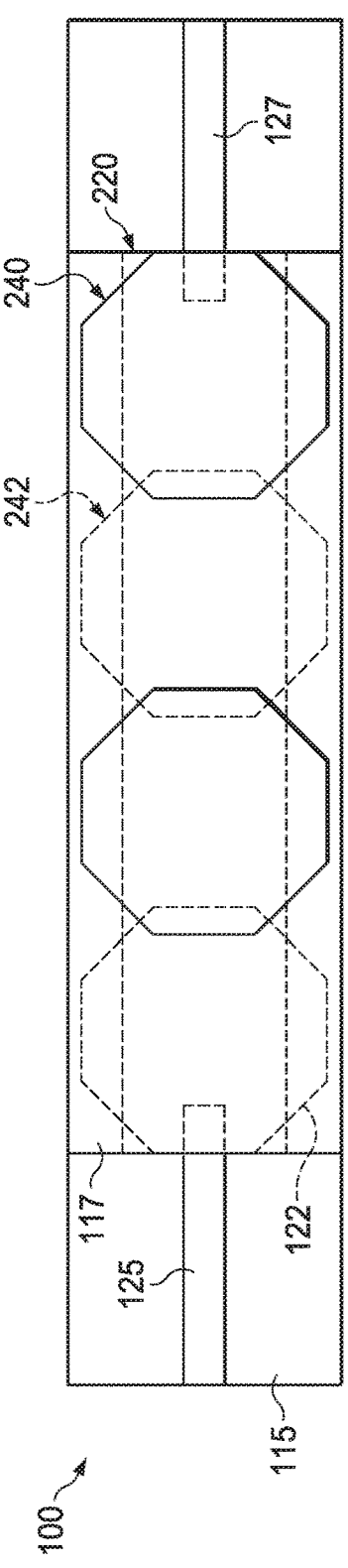
FIG. 2A presents a cross-sectional view of another example electrical device that includes an embodiment of a reconfigurable integrated circuit of the present disclosure, with no voltage applied between overlapping adjacent pairs of top and bottom electrodes separated by an active film layer in a high resistance state (HRS area)
Figure 2A:
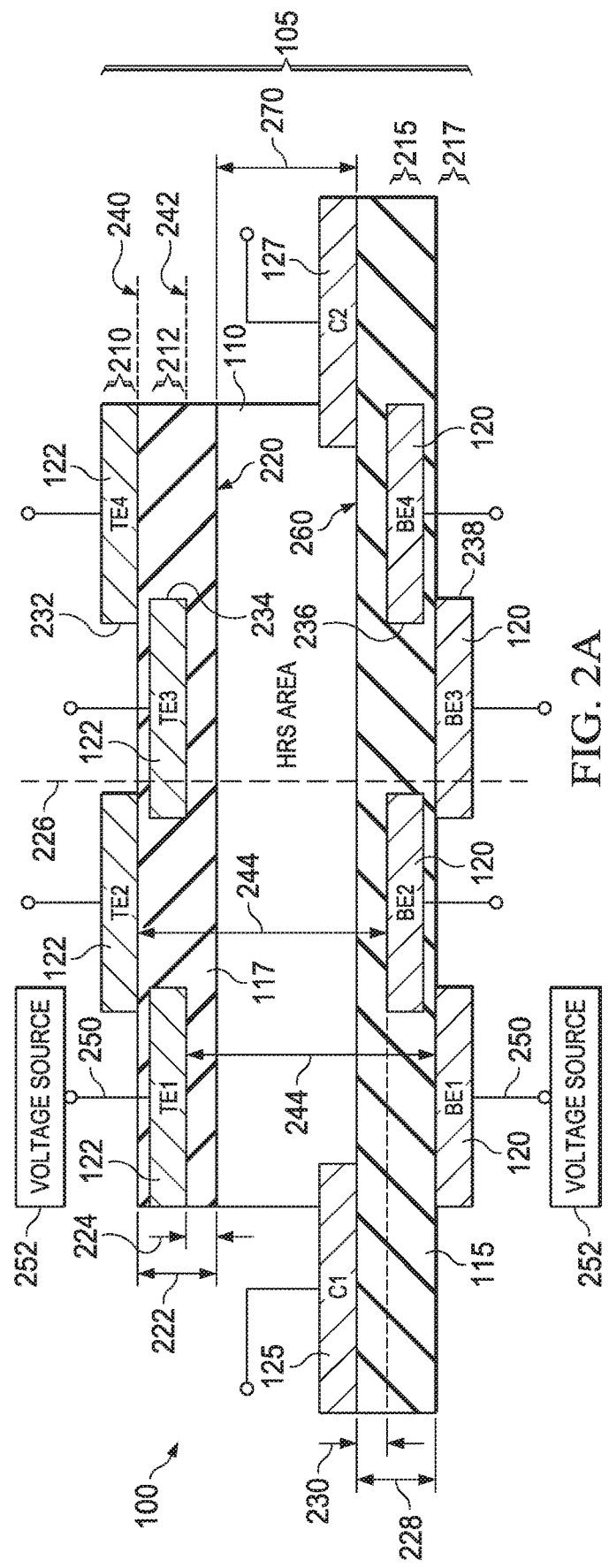
Figure 2B:
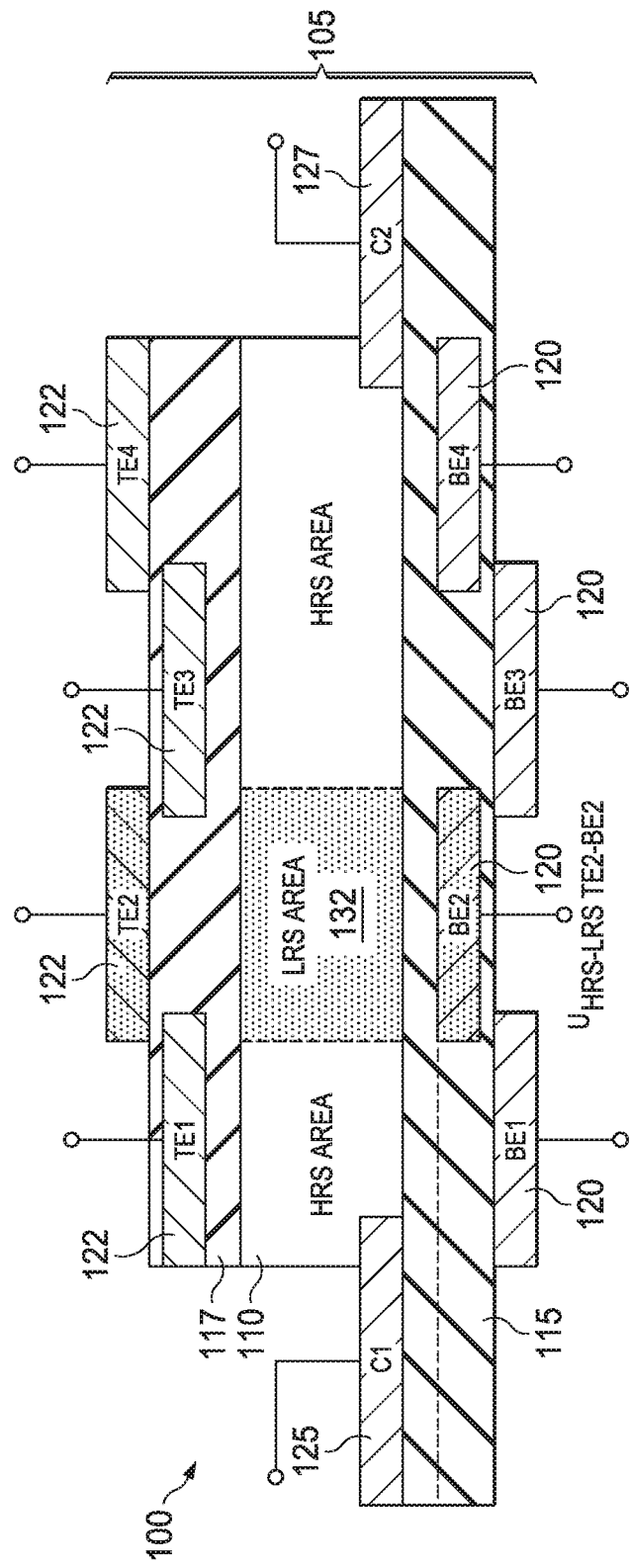
FIG. 2B presents the same view of the example electrical device as shown in FIG. 2A, after applying a voltage (e.g., $U_{HRS-HS}$) between one pair of top and bottom electrodes (e.g., TE2 and BE2, respectively) to form a low resistance state in one area portion (LRS area) of the active film layer of the device.

FIG. 2A presents a cross-sectional view of another example electrical device 100 (e.g., a cross-sectional view through the middle of the active layer) that includes an embodiment of a reconfigurable integrated circuit 105, with no voltage applied, between overlapping adjacent pairs of top and bottom electrodes 122, 120 (e.g., pairs TE1-BE1, TE2-BE2, . . . ) separated from each other by an active film layer 110 in a high resistance state (HRS area). As illustrated, the overlapping top and bottom electrodes 122, 120 are enlarged (e.g., compared to the electrodes shown in FIG. 1A) and placed in two different vertically separated layers (e.g., top electrodes distributed in rows 210, 212 and bottom electrodes distributed in rows 215, 217) that are parallel to a major plane (e.g., major planar surface 220) of the active layer.

As illustrated in FIG. 2A, each of the rows 210, 212 of top electrodes 117 have different separation distances (e.g., distances 222, 224) from the active layer 110 along a dimension (e.g. dimension 226) perpendicular to the major plane 220. Likewise, each of the rows 215, 217 of bottom electrodes 115 have different separation distances (e.g., distances 228, 230) from the active layer 110 along a dimension 226 perpendicular to the major plane 220. Edges of adjacent ones of the top electrodes (e.g., edges 232, 234) in the rows of top electrodes overlap in the dimension perpendicular to the major plane. Edges of adjacent ones of the bottom electrodes (e.g., edges 236, 238) in the rows of bottom electrodes overlap in the dimension perpendicular to the major plane.

As illustrated in the plan top view shown in FIG. 2A', in some embodiments, the top and bottom electrodes 122, 120 can have an octagonal shape, e.g., to facilitate fitting the electrodes in the two or more rows. For instance as shown in FIGS. 2A and 2A', the top electrodes 122 has an octagonal shape in planes 240, 242 parallel to their respective different rows 210, 212. Other embodiments of the electrodes 120, 122 can have other shapes, e.g., circular or hexagonal shapes, to form different areas of vertical overlap between adjacent pairs of top electrodes or between adjacent pairs of bottom electrodes in the different rows (e.g., between electrodes 120 in rows 210, 212, and/or, between electrodes 120 in rows 215, 217.

An advantage of the embodiments such as show in FIGS. 2A and 2A' is that the cell areas in the horizontal and vertical direction can have a slight overlap, thus facilitating better control, and provide a greater homogeneity, of the resistivity of the (horizontal or vertical) boundary area of adjacent cells, e.g., by providing a more uniform electrical field density through the cells. In some such embodiments, relative to an embodiment of non-overlapping electrodes such as shown in FIGS. 1A-1D, a lower voltage between pairs of top and bottom electrodes may be needed for changing the resistivity of the respective cells. In still other embodiments, there may be a common bottom (or top) electrode associate with a group of cells.

As illustrated in FIG. 2A, in some embodiments, a first insulating layer 115 can be located between the bottom electrodes 120 and the active layer 110 and a second insulating layer 117 can be located between the top electrodes 122 and the active layer 110. In some embodiments, the first row 210 of top electrodes 122 are located on the second insulator layer 117 and the second row 212 of top electrodes 122 are located in the second insulator layer 117, and, the first row 215 of bottom electrodes 120 are located in the first insulator layer 115 and the second row 217 of bottom electrodes 120 are located on the first insulator layer 115.

As illustrated in FIG. 2A, in some embodiments, to facilitate forming same uniform electric fields in different portions of the active layer, the paired top and bottom electrodes (e.g., paired electrodes TE1 and BE1, and, TE2 and BE2) are separated from each other by a same distance 244. For instance, for some such embodiments, the paired top and bottom electrodes include the top electrodes 122 of the second row 212 (e.g., TE1 and TE3) and the bottom electrodes 120 (e.g., BE1 and BE3) of the second row 217, and, the top electrodes 122 (e.g., TE2 and TE4) of the first row 210 and the bottom electrodes 120 (e.g., BE2 and BE4) of the first row 215. However, in other embodiments, the distance could vary as long as other adjustments are being made in the programming cycle.

As illustrated in FIG. 2A, in some embodiments, each one of the bottom and top electrodes 120, 122 can be connected to separate leads 250 (e.g., wire leads). In some such embodiments the device 100 can include a voltage source 252 connected to the bottom and top electrodes 120, 122 by the leads 250. In some embodiments, the voltage source (e.g., a programmable voltage pulse generator) can be configured to apply the voltages to the paired top and bottom electrodes (e.g., TE1 and BE1).

Figure 2C:
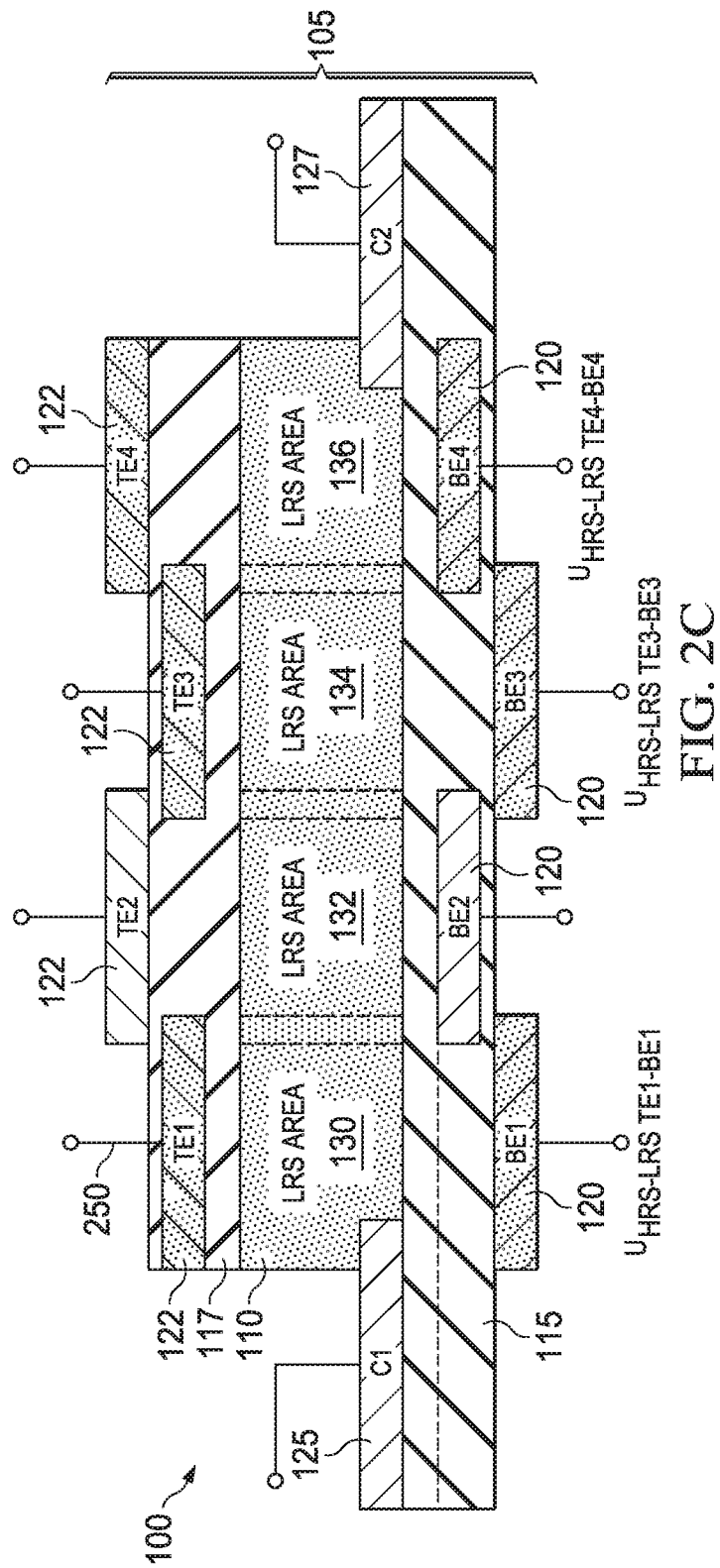
FIG. 2C presents the same view of the example electrical device as shown in FIG. 2B, after applying a voltage (e.g., $U_{HRS-HS}$) between multiple pairs of top and bottom pairs of electrodes (e.g., TE1 and BE1, TE3 and BE3, and TE4 and BE4,) to form a low resistance state in multiple area portions (LRS area) of the active film layer of the device.
Figure 2D:
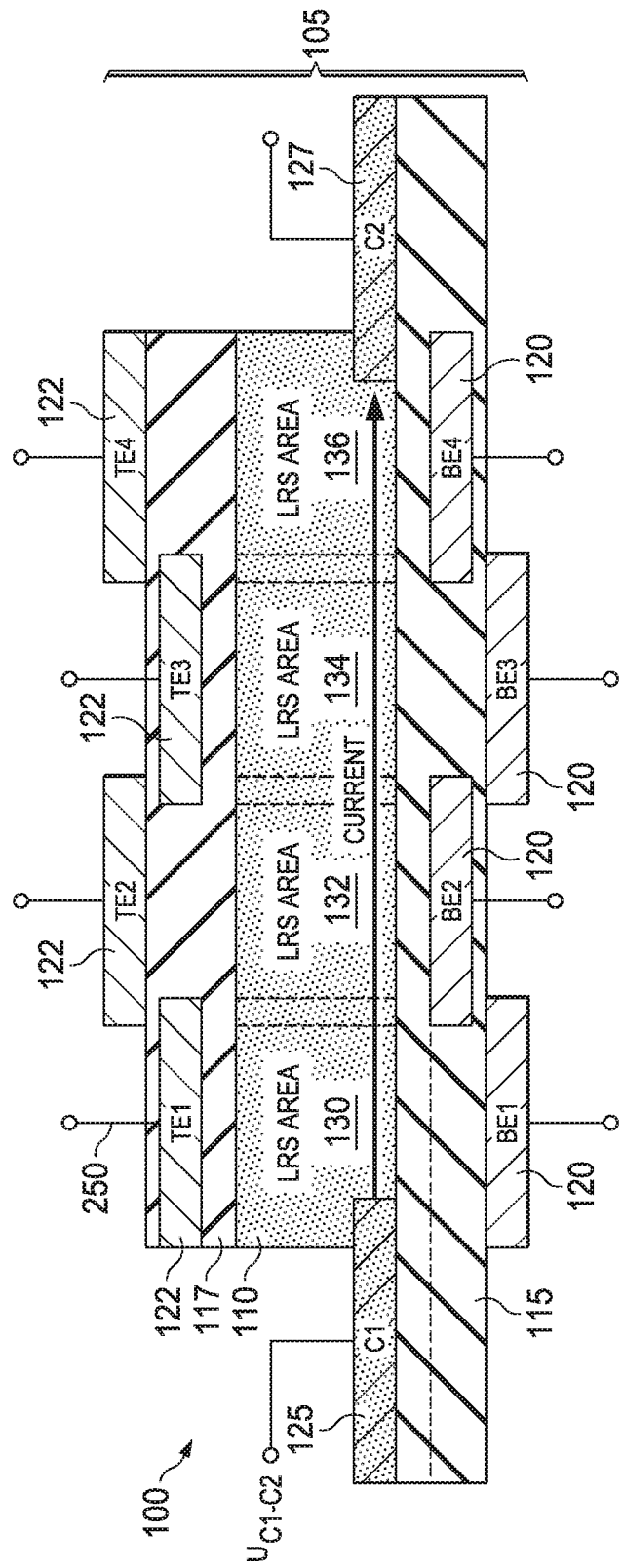
FIG. 2D presents the same view of the example electrical device as shown in FIG. 2C, and further shows a current passing through the area portions of the active film layer in the low resistance state from a first contact layer (C1) to a second contact layer (C2)

Analogous to FIGS. 1B-1D, FIG. 2B shows the example electrical device after applying a voltage (e.g., $U_{HRS-HS}$) between one pair of top and bottom electrodes 122, 120 (e.g., TE2 and BE2, respectively) to form a low resistance state in one area portion (e.g., LRS area corresponding to cell 132) of the active film layer of the device, FIG. 2C shows the example electrical device after applying a voltage (e.g., $U_{HRS-LHS}$) between multiple pairs of top and bottom pairs of electrodes 122, 120 (e.g., TE1 and BE1, TE2 and BE2, TE3 and BE3, and TE4 and BE4,) to form a low resistance state in multiple area portions (LRS areas corresponding to cells 130 . . . 134) of the active film layer 110 of the device 100, and, FIG. 2D show the example electrical device with a current ("Current") passing through the area portions of the active film layer 110 in the low resistance state from a first contact layer 125 (C1) to a 127 second contact layer (C2).

Figure 3A:
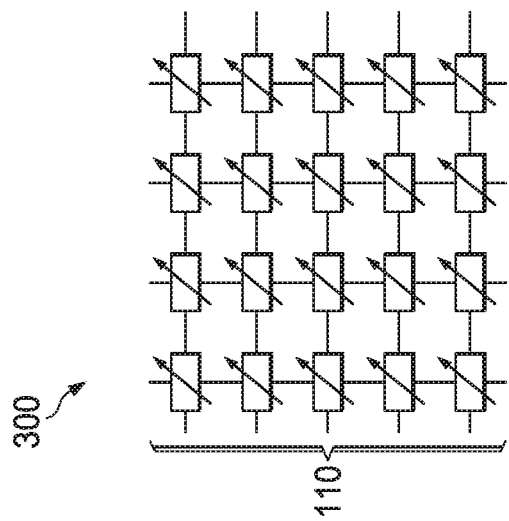
FIGS. 3A-B present plan views of a schematic equivalent electric circuit of a two-dimensional array of cells corresponding to different portions of an active film layer that are individually switchable between low and high resistance states (LHS and HRS, respectively) by applying voltages to the top and bottom electrodes adjacent to selected different portions (e.g., cells at coordinates C(row, column)) of the film layer, as follows A) no voltages applied, B) voltages applied to cells C(3,1), C(3,2), C(3,3), C(2,3), C(1,3)
Figure 3B:
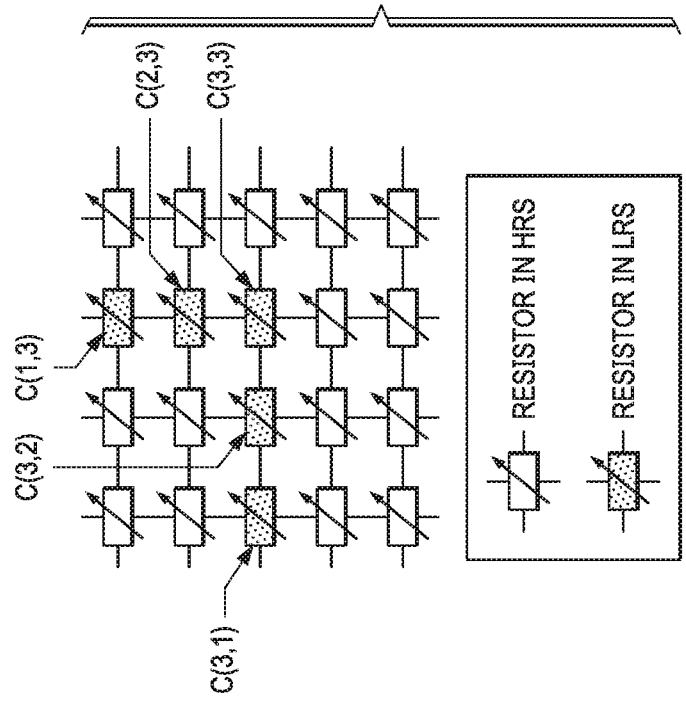
Figure 3C:
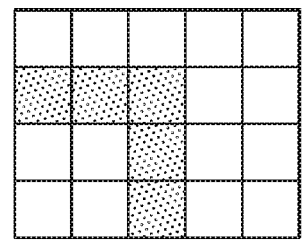
FIG. 3C present a high-level schematic plan view of the equivalent electric circuit two-dimensional array of cells in low and high resistance states as depicted in FIG. 3B.

FIGS. 3A-B present plan views of a schematic equivalent electric two-dimensional array of cells 300, corresponding to different portions of an active film layer 110, that are individually switchable between low (LHS) and high (HRS) resistance states by applying voltages to the top and bottom electrodes (e.g., rectilinear shaped electrodes) adjacent to selected different portions (e.g., cells at coordinates C(row, column)) of the film layer 110, as follows A) no voltages applied, B) voltages applied to cells C(3,1), C(3,2), C(3,3), C(2,3), C(1,3). FIG. 3C present a high-level schematic plan view of the equivalent electric two-dimensional array of cells in low (LHS) and high (HRS) resistance states as depicted in FIG. 3B.

For instance, in devices 100 analogous to that depicted in FIGS. 2A-2A' in some embodiments, the paired top electrodes 122 and bottom electrodes 120 form two-dimensional arrays over the top major surface (e.g., planar surface 220) and bottom major surface (e.g., planar surface 260) of the active layer 110, respectively.

FIG. 3A provides an illustrative example of a 4×5-array of cells where each cell can be modeled as a variable resistor with north, south, east and west connectors. As illustrated in FIG. 3B, applying a voltage to the top and bottom electrodes of cells C(3,1), C(3,2), C(3,3), C(2,3), C(1,3), can form a low-resistance path, e.g., to establish an electrically conductive. In view of this example one skilled in the pertinent art would understand how changing the resistivity of various cell from HRS to LRS it would be possible to form any number of different integrated circuit layouts.

The schematic electrical equivalents shown in FIGS. 3A-3C use variable resistors as representations of the cells 300 (e.g., having two or more resistive states). Although the cells are represent in this scheme as squares based on the present disclosure one skilled in pertinent art would understand how the shape of the top and bottom electrodes for each of the cells could have different shapes (e.g., octagonal or other shapes), with or without vertical overlap, e.g., as already discussed in the context of FIG. 2A'. Additionally, the cells 300 are represented as having up to four electrical connections to horizontally adjacent cells. Based on the present disclosure one skilled in the pertinent arts would appreciate how vertical electrical connections could be present for vertically adjacent cells in a three-dimensional array of the cells 300.

The active film layer can be made of materials whose resistivity can be changed from a high to low or low to high resistivity by applying a voltage potential across a layer of such a material. In some embodiments, the active film layer comprises, and in some embodiments consists of, a memristive material (e.g., a memory resistor). In some embodiments, the active film layer comprises, and in some embodiments consists of, a meta-material. In some embodiments, the active film layer comprises, and in some embodiments consists essentially of, memristive material or meta-material, where the layer may contain trace amounts (e.g., less than 1, 0.1 or 0.01 wt %) of non-memristive materials or non-meta-materials that do not affect the ability of the material's resistivity to be changed by applying the voltage potential as described herein.

Based upon the present disclosure one skilled in the pertinent arts would understand that the material to be used as the active film layer should have the chemical composition, structural form, and electrical properties for effective implementation of resistive switching effect, including, consideration of the peak ratio of resistances between low-resistance and high-resistance states, lowest resistance values in the low-resistance state, low switching time, and length of a particular resistive state storage time.

Non-limiting examples of suitable materials which possess a memristive effect include metal oxides such as $MgO_x$, $AlO_x$, $SiO_x$, $TiO_x$, $CrO_x$, $MnO_x$, $FeO_x$, $CoO_x$, $NiO_x$, $CuO_x$, $ZnO_x$, $GaO_x$, $GeO_x$, $ZrO_x$, $NbO_x$, $MoO_x$, $HfO_x$, $TaO_x$, $WO_x$, $CeO_x$, $GdO_x$, $YbO_x$, $LuO_x$, $LaAlO_3$, $SrTiO_3$, $BaTiO_3$, Lanthanum Calcium Manganese Oxide (LCMO), Lanthanum strontium manganite (LSMO), Praseodymium Calcium Manganese Oxide (PCMO), $BiFeO_3$, etc . . . ; chalcogenides such as $Cu_2S$, $GeS_x$, $Ag_2S$, $Ge_xSe_y$, etc . . . ; Nitrides such as AlN, SiN, etc. . . . ; or others such as a-C, graphene oxide, a-Si, AgI, etc . . . . , familiar to those skilled in the pertinent art. Non-limiting examples of suitable phase-change meta-materials include $MoO_3$, $V_2O_5$, GeTe, $Sb_2Te$, or other materials with the ability to undergo a phase transition between different resistive states under the influence of an electric field.

Embodiments of the active layer can include single-crystalline, poly-crystalline, nano-crystalline, or amorphous structural forms of such materials having a resistive switching effect such as disclosed herein.

In some embodiments, the active layer (e.g., layer 110 in FIG. 2A) can include different material layers each having different states of resistivity for a given applied voltage, e.g., to facilitate implementation of not Boolean logic elements as part of the reconfigurable IC.

In some embodiments, to facilitate forming uniform resistivity states using low applied voltages, the active film layer can have a thickness (e.g., thickness 270 in FIG. 2A) in a range from 10 to 10000 nanometers).

In some embodiments, the voltage applied between top and bottom electrodes (e.g., voltage applied to electrodes TE2 and BE2 in FIG. 2B) to switch a portion of the active film layer from HRS to LRS (e.g., cell 132 in FIG. 2B) can be a voltage in a range from 1 to 10000 mV. In some such embodiments, the voltage is applied for a time period in a range from 0.01 ns to 10000 ns.

In some embodiments, the HRS of the active film layer has a resistivity (e.g., Ohm cm) that can be at least 10 times greater than a resistivity of the LRS of the active film layer.

One skilled in the pertinent arts would be familiar with conventional materials and techniques used in the semiconductor industry to deposit and pattern, e.g., using physical or vapor deposition and photolithography procedures, respectively, the various structural elements of the reconfigurable IC. Non-limiting examples of the materials used to form the top and bottom electrodes and contacts (e.g., electrodes 120, 122 and contacts 125, 127 in FIG. 2A) include silver, gold, copper, aluminum or multilayered combinations thereof. Non-limiting examples of materials used to form the insulating layers (e.g., insulating layers 115, 117 in FIG. 2A) include silicon dioxide. In some embodiments, the insulating layers can be made of the same material while in other embodiments different insulating layers can be made of different materials.

In some embodiments of the device, arrays (e.g., 1-2- or 3-dimensional arrays) of cell structures can be used to write, read, store and erase a binary digit (e.g., a bit) of information. This is illustrated for a four-cell configuration shown in FIGS. 4A-4E.

FIG. 4A presents a cross-sectional view of an example electrical device 100 analogous to that shown in FIG. 1A, with no voltage applied between pairs of top and bottom electrodes 122, 120 separated by an active film layer 110 in a high resistance state (HRS area).

FIG. 4B presents the same example electrical device after a voltage (e.g. a write voltage UW TE2-BE2) is applied between a pair of top and bottom electrodes separated by the active film layer to form a low resistance state in one area portion (LRS area) or cell 132 of the active film layer 110 to write an information bit 1 to the cell, e.g., by switching resistivity in the cell from HRS (e.g., bit 0) to LRS (e.g., bit 1).

FIG. 4C presents the same example electrical device 100 with the resistance state of the cell being read, e.g., by using a lower voltage (e.g., a read voltage $U_{R\ TE\text{-}BE}$ where $U_{R\ TE2\text{-}BE2} < U_{W\ TE\text{-}BE}$) to read the state of resistivity of the cell.

FIG. 4D presents the same view of the example electrical device 100 as shown in FIG. 4C, after the low resistance state of the cell 132, is written to another cell 134, e.g., by applying a voltage (e.g., write voltage $U_{W\ TE3\text{-}BE3}$) between another pair of top and bottom electrodes 122, 120 (e.g., TE3, BE3) separated by another area portion of the active film layer 110 to form a same low resistance state in the other area portion (second LRS area) corresponding to the other cell 134.

FIG. 4E presents the same view of the example electrical device 100 after the low resistance state of the cell 132 is erased, e.g., by applying a voltage (e.g., erase voltage $U_{E\ TE2\text{-}BE2}$) between the pair of top and bottom electrodes 122, 120 (e.g., TE2, BE2) separated by the area portion of the active film layer 110.

Figure 5A:
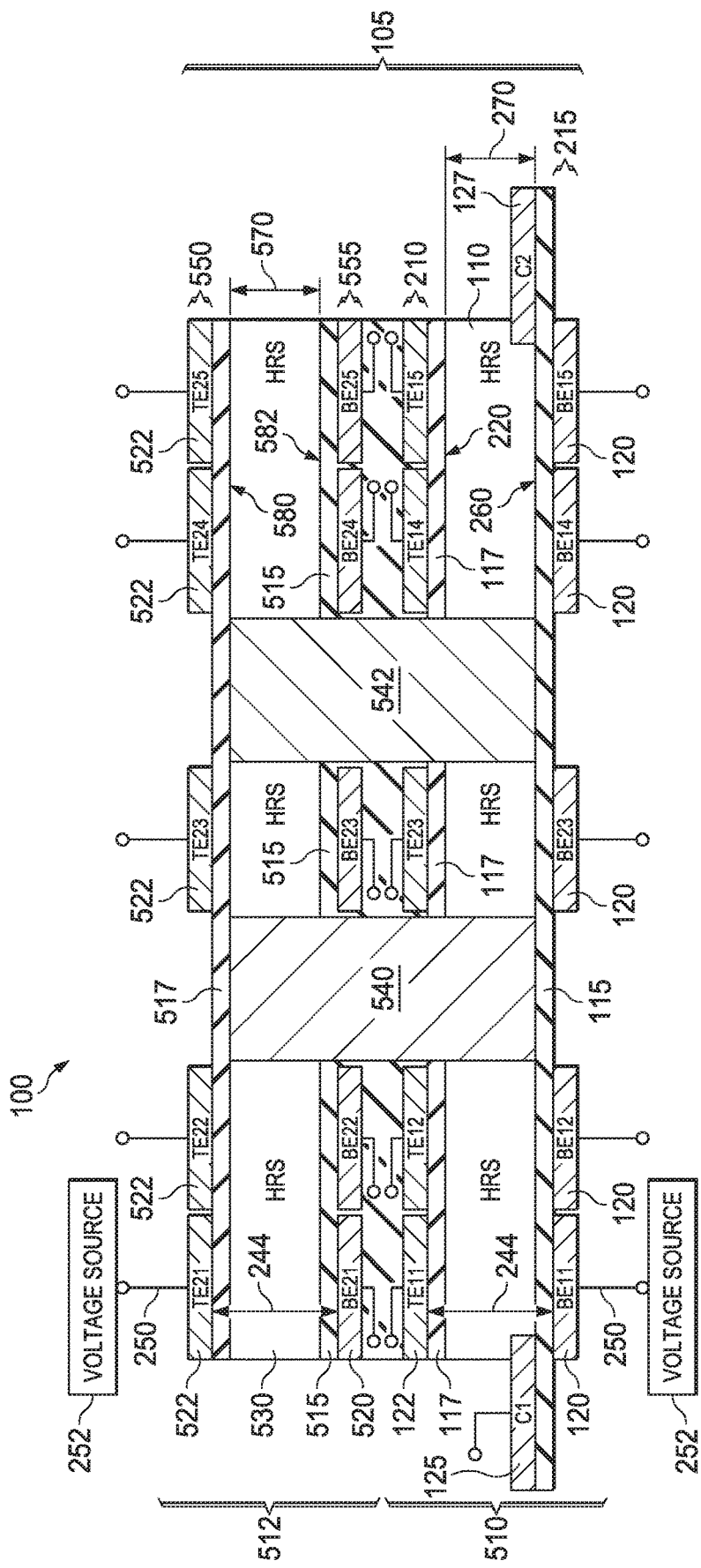
FIG. 5A presents a cross-sectional view of an example electrical device analogous to that shown in FIG. 1A, the device having a first set of pairs of top and bottom electrodes (e.g., TE11 and BE11, TE12 and BE12, etc. . . . ) separated by a first active film layer and a second set of pairs of top and bottom electrodes (e.g., TE21 and BE21, TE22 and BE22, etc. . . . ) separated by a second active film layer, the second active film layer interconnected to the first metamaterial layer by conductive vias, with no voltage applied to any of the pairs of electrodes resulting in high resistive states (HRS) in both of the first and second active film layers.
Figure 5B:
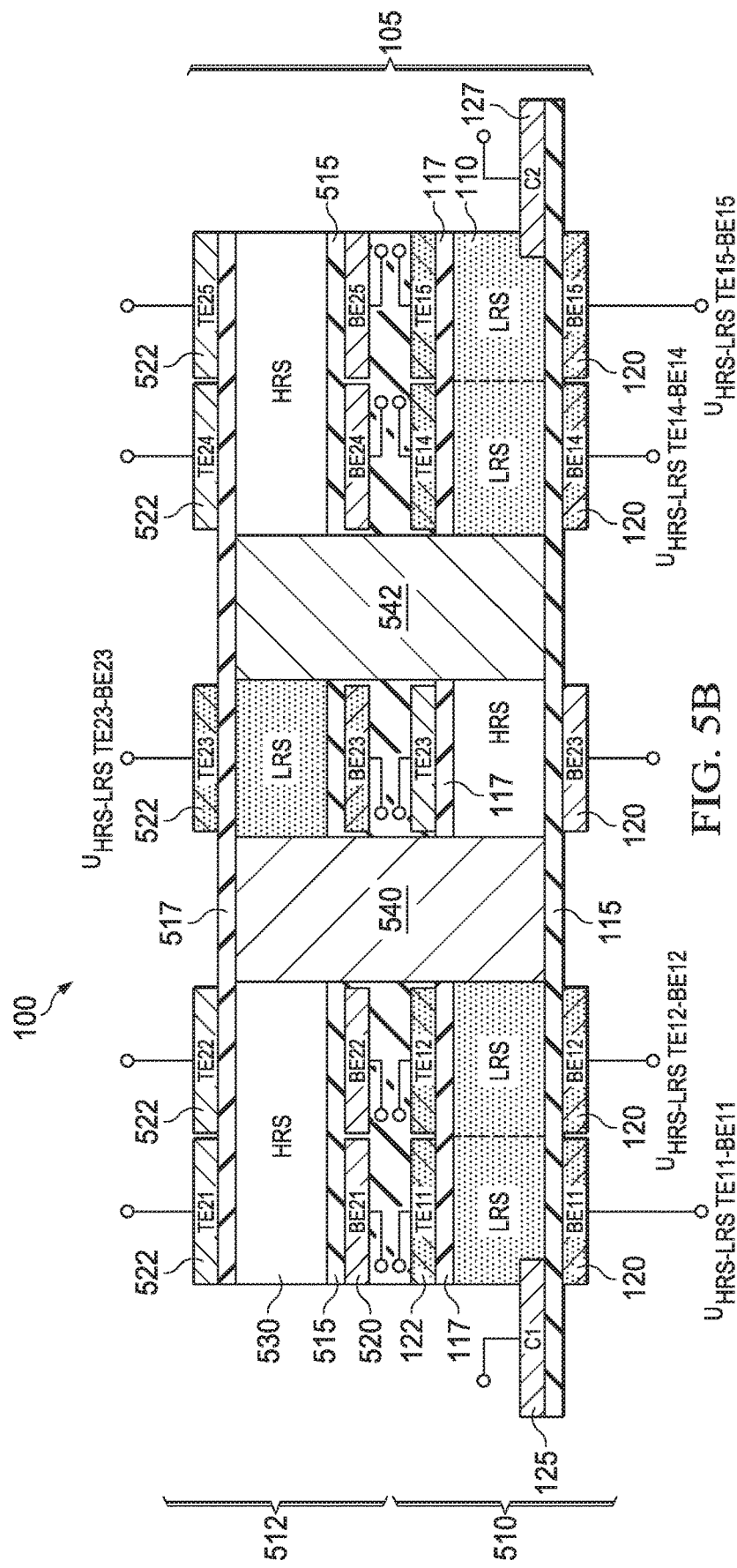
FIG. 5B presents the same view of the example electrical device as shown in FIG. 5A, with voltages (e.g., $U_{HRS-HS}$) applied to TE11 and BE11, TE12 and BE12, TE14 and BE14, and TE15 and BE15 of the first set of pairs of electrodes, and applied to TE23 and BE23 of the second set of pairs of electrodes, to reconfigure portions of the active film layers between these electrode pairs from a high resistive state to a low resistance state (LHS)

In some embodiments of the electrical device 100, as illustrated in FIGS. 5A-5C, to facilitate forming more complex circuit layouts (e.g., 3-dimension arrays of cells), the device 100 can include multiple active film layers. These layers can be connected to each other by conductive vias. This allows circuits 105 to be routed across cell in multiple layers and to achieve a high utilization. Such a configuration and its use are illustrated for two active film layers 110, 530 in FIGS. 5A-5C.

FIG. 5A presents a cross-sectional view of an example electrical device 100 analogous to that shown in FIG. 1A, the device comprising an integrated circuit 105 that includes a first set 510 of pairs of top and bottom electrodes 122, 120 (e.g., TE11 and BE11, TE12 and BE12, etc. . . . ) separated by a first active film layer 110 and a second set 512 of pairs of top and bottom electrodes 522, 520 (e.g., TE21 and BE21, TE22 and BE22, etc. . . . ) separated by a second active film layer 530, the second active film layer interconnected to the first metamaterial layer 110 by one or more conductive vias (e.g., interlayer vias 540, 542). Similar to that described in the context of FIGS. 1A-2D, a resistivity state (e.g., HRS or LRS) of portions of the active layers 110, 530 are independently changeable by a voltage applied to one or more of the paired top and bottom electrodes 120, 122, 520, 522 of the first set 510 or the second set 515.

As illustrated in FIG. 5A, some embodiments further include a first insulating layer 115 between the bottom electrodes 120 of the first set 510 and the first active layer 110, a second insulating layer 117 between the top electrodes 122 of the first set 510 and the first active layer 110, a third insulating layer 515 between the bottom electrodes 520 of the second set 512 and the second active layer 530 and a fourth insulating layer 517 between the top electrodes 522 of the second set 512 and the second active layer 530.

As illustrated in FIG. 5A, for some embodiments, each of the top and bottom electrodes 120, 122, 520, 522 of the first set and the second set 510, 512 are located in single rows (e.g., rows 210, 215, 550, 555).

In some such embodiments, the bottom electrodes 120 of the first set 510 are located on a first insulator layer 115 (e.g., in first row 215), the top electrodes 122 of the first set 510 are located on a second insulator layer 117 (e.g., in second row 210), the bottom electrodes 520 of the second set 512 are located on a third insulator layer 515 (e.g., in third row 555) and the top electrodes 522 of the second set 512 are located on a fourth insulator layer 517 (e.g., in fourth row 550).

As illustrated in FIG. 5A, in some embodiments, the top electrodes 122, 522 are non-overlapping and the bottom electrodes 120, 520 are non-overlapping. However in other embodiments, analogous to that shown in FIG. 2A, the top electrodes are distributed in two or more rows and the bottom electrodes are distributed in two or more rows parallel to the major plane of the first active layer or the second active layer. In some such embodiments, analogous to that shown and discussed in the context of FIG. 2A', the electrodes can have octagonal, hexagonal or other non-rectilinear shapes.

As illustrated in FIG. 5A, in some embodiments, the paired top and bottom electrodes 122, 120 of the first set 510 and the paired top and bottom electrodes 522, 520 of the second set 512 are separated from each other by a same distance 244. In some such embodiments, the first and second active layers 110, 530 have same thicknesses 270, 570 (e.g., within ±1%).

In some embodiments, the paired top and bottom electrodes 122, 120 of the first set 510 and the paired top and bottom electrodes 522, 520 of the second set 512 form two-dimensional arrays, e.g., such as depicted in FIG. 3A, over the top major surface 220 and bottom major surface 260 of the first active layer 110, and over the top major surface 580 and bottom major surface 582 of the second active layer 530, respectively. Such embodiments of the device 100 include a three-dimensional array of reconfigurable cells.

As illustrated in FIG. 5A, embodiments of the device 100 can include including contact electrodes 125, 127 touching different portions of the at least one of the first active layer 110 or the second active layer 530. In some embodiments electrical contacts touch one of the first active layer 110 and the second active layer 530 or additional active layers if so configured.

As illustrated in FIG. 5A, each one of the top and bottom electrodes (top and bottom electrodes 122, 120 of the first set 510 and top and bottom electrodes 522, 520 of the second set 512) can be connected to separate leads 250.

As illustrated in FIG. 5A, the device 100 can include a voltage source 252 connected to each one of the top and bottom electrodes (top and bottom electrodes 122, 120 of the first set 510 and top and bottom electrodes 522, 520 of the second set 512) by electrical leads 250, the voltage source configured to apply the voltages to the paired top and bottom electrodes (e.g., any one or more of the paired electrodes TE11-BE11, TE12-BE12 . . . TE21-BE21, TE22-BE22 . . . ).

FIG. 5A shows the device 100 with no voltage applied to any of the paired electrodes, resulting, e.g., in high resistive states (HRS) in both of the first and second active film layers.

FIG. 5B presents the same view of the example electrical device with voltages (e.g., $U_{HRS\text{-}LHS}$) applied to electrodes 120, 122 (e.g., TE11 and BE11, TE12 and BE12, TE14 and BE14, and TE15 and BE15) of the first set of pairs of electrodes 510, and applied to electrodes 520, 522 (e.g., TE23 and BE23) of the second set of pairs of electrodes 512, to reconfigure corresponding portions of the active film layer 110 (e.g., the portions between TE11 and BE11, TE12 and BE12, TE14 and BE14, and TE15 and BE15, respectively) and the active film layer 530 (e.g., the portion between TE23 and BE23) between these electrode pairs from a high resistive state (HRS) to a low resistance state (LRS).

FIG. 5C presents the same view of the example electrical device showing a current passing ("Current") through the portions of the active film layers 110, 530 and interlayer vias 540, 542 in the low resistance state from a first contact layer 120 (C1) to a second contact layer 127 (C2).

Figure 6A:
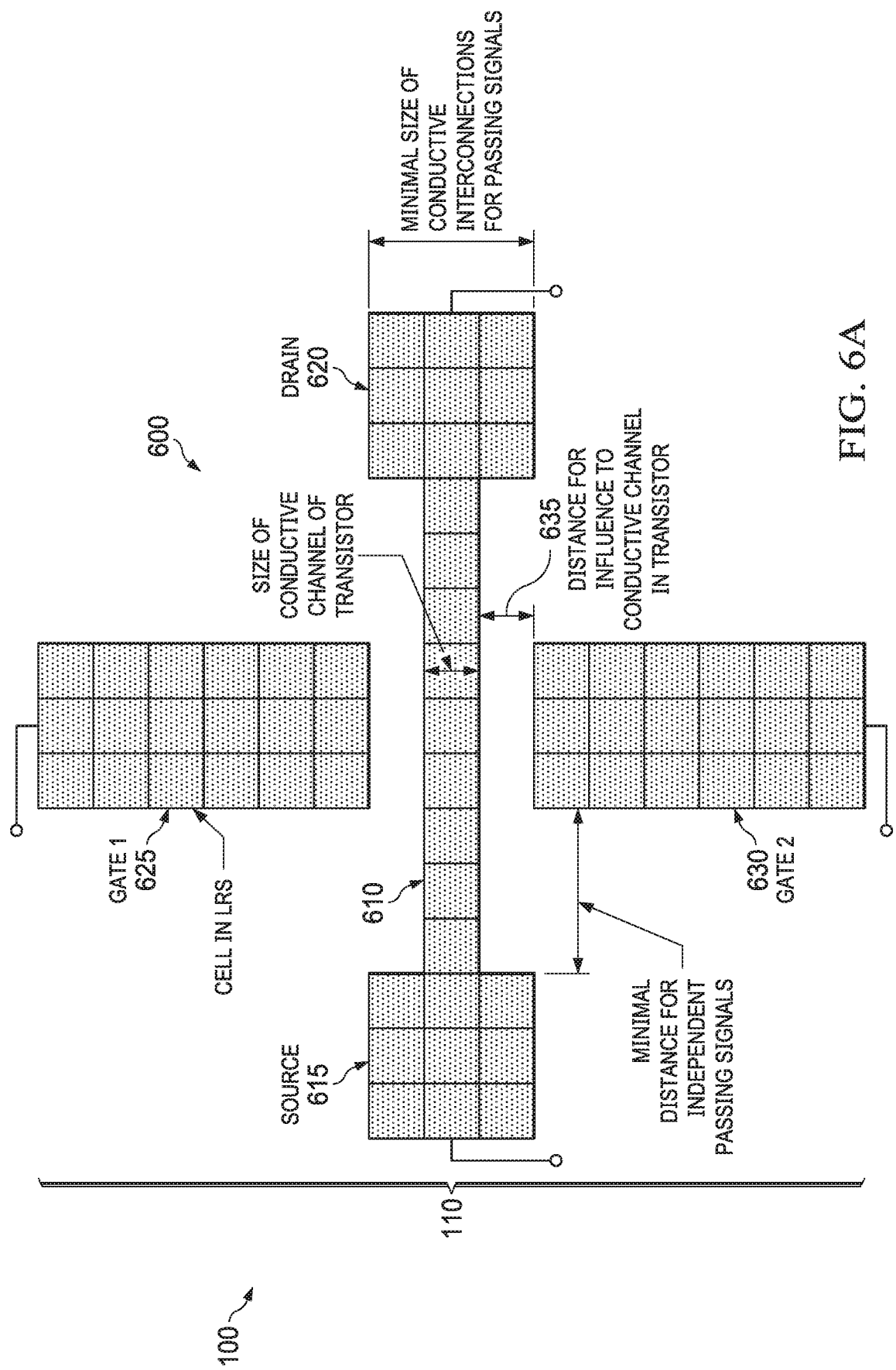
FIG. 6A presents a plan view schematic of an example transistor structure of the disclosure, the transistor structure including portions or cells of an active film layer that is between discrete separate pairs of top and bottom electrodes such as discussed in the context of FIGS. 1A-5C where all of the selected portions are configured to be in a low resistive state.
Figure 6B:
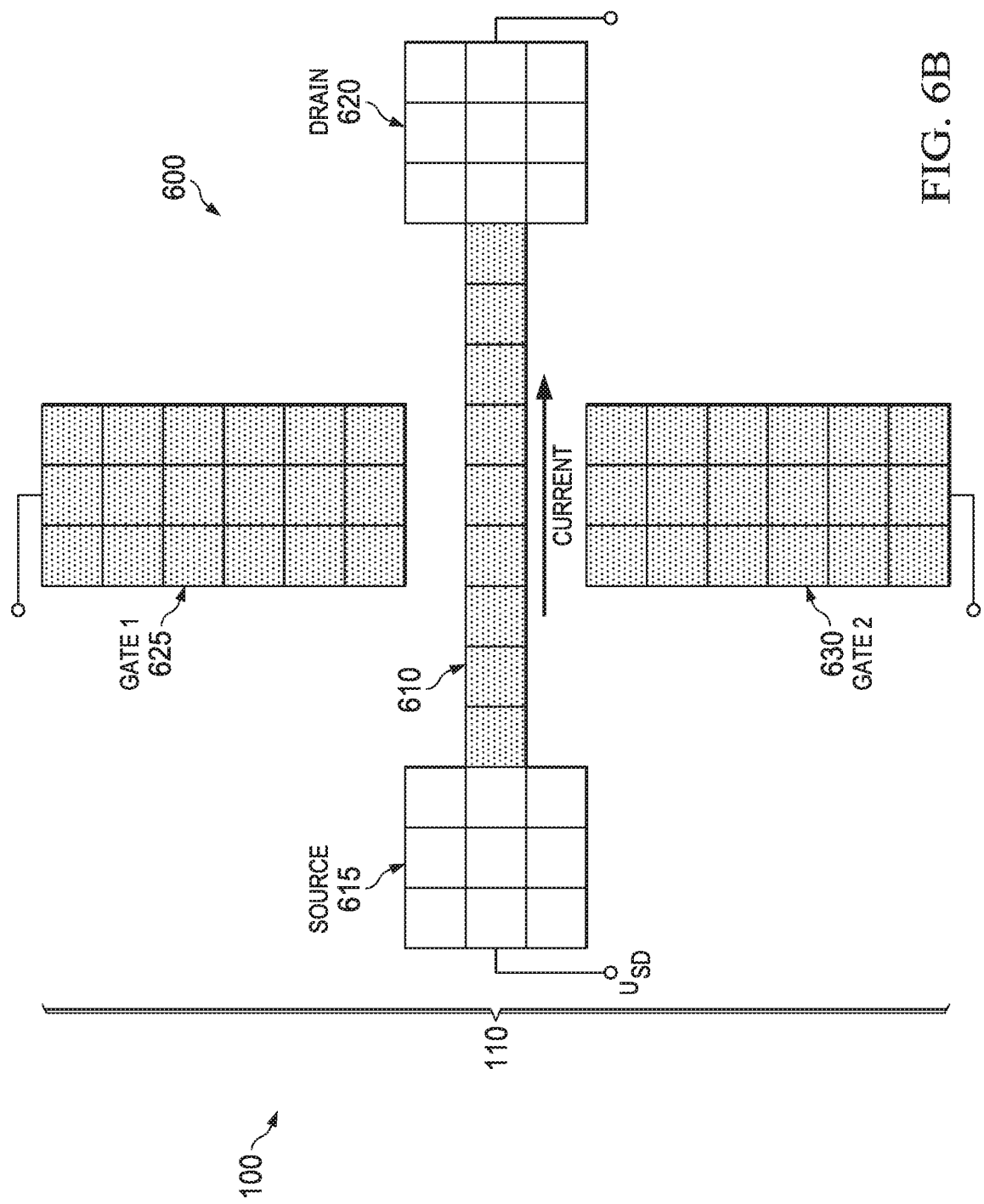
FIG. 6B presents the same view of the example transistor structure shown in FIG. 6A, where cells corresponding to source and drain structures of the transistor structure are configured to be in a high resistive state and a current is passed from the source to drain.
Figure 6C:
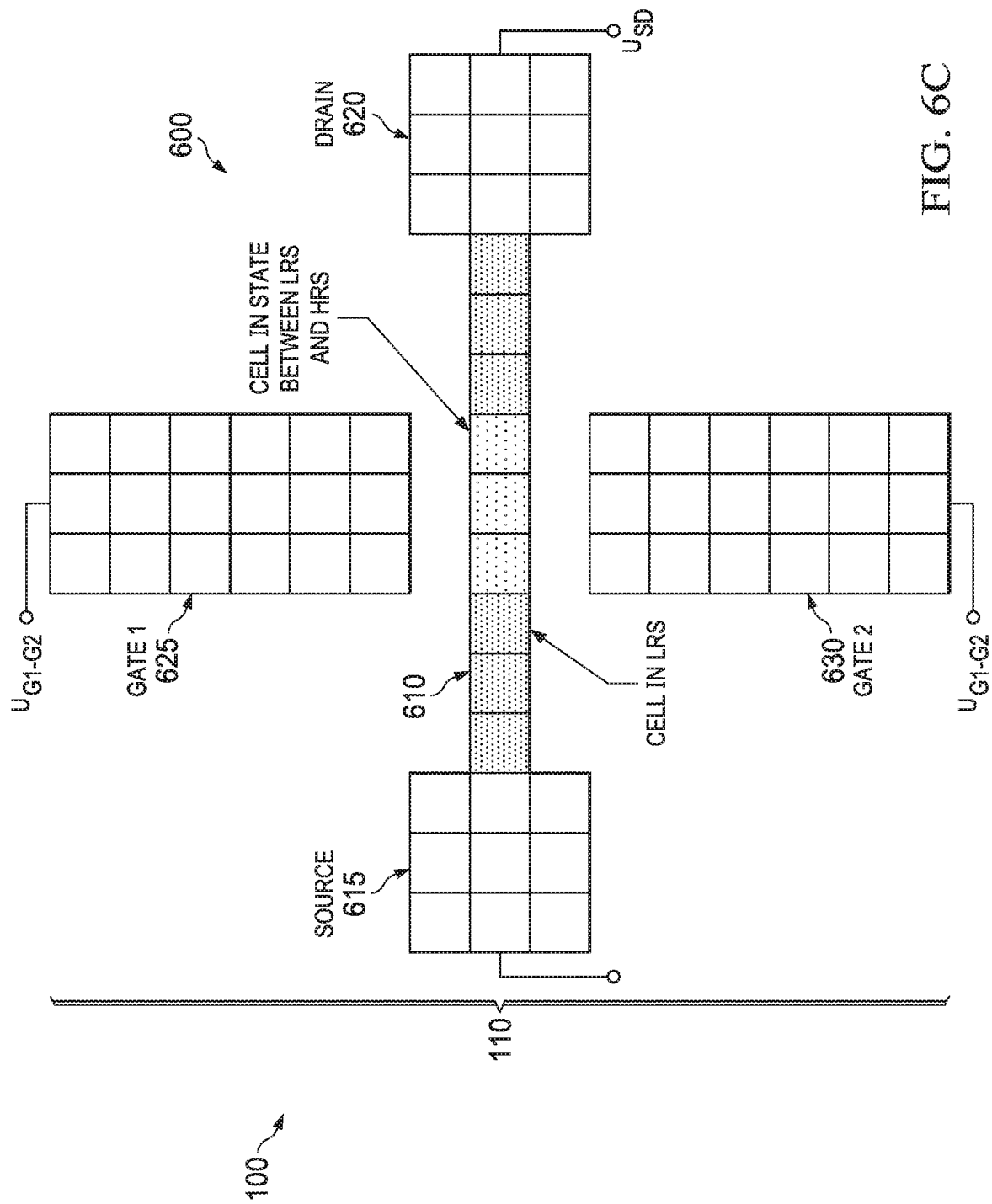
FIG. 6C presents the same view of the example transistor structure shown in FIG. 6B, where cells corresponding to source, drain and first and second gate structures of the transistor structure are configured to be in a high resistive state, cells between the source and drain but not between the gate structure are configured to be in a low resistive state and cells between the source and drain and between the gate structure are configured an intermediate resistive state that is intermediate in resistivity between the high and low resistive states.

In some embodiments of the electrical device, portions of the active film layer can be configured to a transistor structure. As disclosed herein, applying voltages between top and bottom electrodes changes the resistivity of cells. Similar effects during applying voltage laterally between cells configured as LRS areas can be used for changing resistivity of cells that are located between these nearest LRS areas. FIGS. 6A-6C present examples of such transistor structures.

FIG. 6A presents plan view schematic of an example transistor structure 600 of the disclosure, the transistor structure 600 including portions or cells of an active film layer 110 of the device 100 that are between discrete separate pairs of top and bottom electrodes such as discussed in the context of FIGS. 1A-5C where all of the selected portions are configured to be in a low resistive state.

As illustrated, in some embodiments, two sides of a thin conductive channel 610 can be used as source and drain structures 615, 620 two gates 625, 630 (e.g., Gate 1, Gate 2) can be located perpendicular to the thin conductive channel 610 at a distance 635 allowing use of a voltage applied between gates to change the resistivity of the channel. Several physical effects can be used for the implementation of, e.g., changing of number of energy levels in quantum 1D structure of a thin conductive channel or producing lateral resistive switching effects.

FIG. 6B presents the same view of the example transistor structure 600 where cells corresponding to source and drain structures 615, 620 of the transistor structure 600 are configured to be in a high resistive state and a current ("Current") is passed from the source to drain 615, 620.

FIG. 6C presents the same view of the example transistor structure 600 where cells corresponding to source, drain 615, 620 and first and second gate structures 625, 630 of the transistor structure 600 are configured to be in a high resistive state, cells between the source and drain but not between the gate structure are configured to be in a low resistive state and cells between the source and drain and between the gate structure are configured an intermediate resistive state that is intermediate in resistivity between the high and low resistive states.

FIG. 7 presents an electric circuit diagram that is electrically equivalent to the transistor structure 600 depicted in FIGS. 6A-6C, where e.g., for a voltage between the source and drain (USD) and between the first and second gate ($U_{G1\text{-}G2}$) the resistivity of the source 615 ($R_S$), drain 620 ($R_D$), first gate 625 ($R_{G1}$) and second gate ($R_{G2}$) can be altered according to the resistive state of the cells selected to define these components.

Some embodiments of the electrical device include a reconfigurable IC structure. An example of such a structure and its use is presented in FIGS. 8A-19.

Figure 8A:
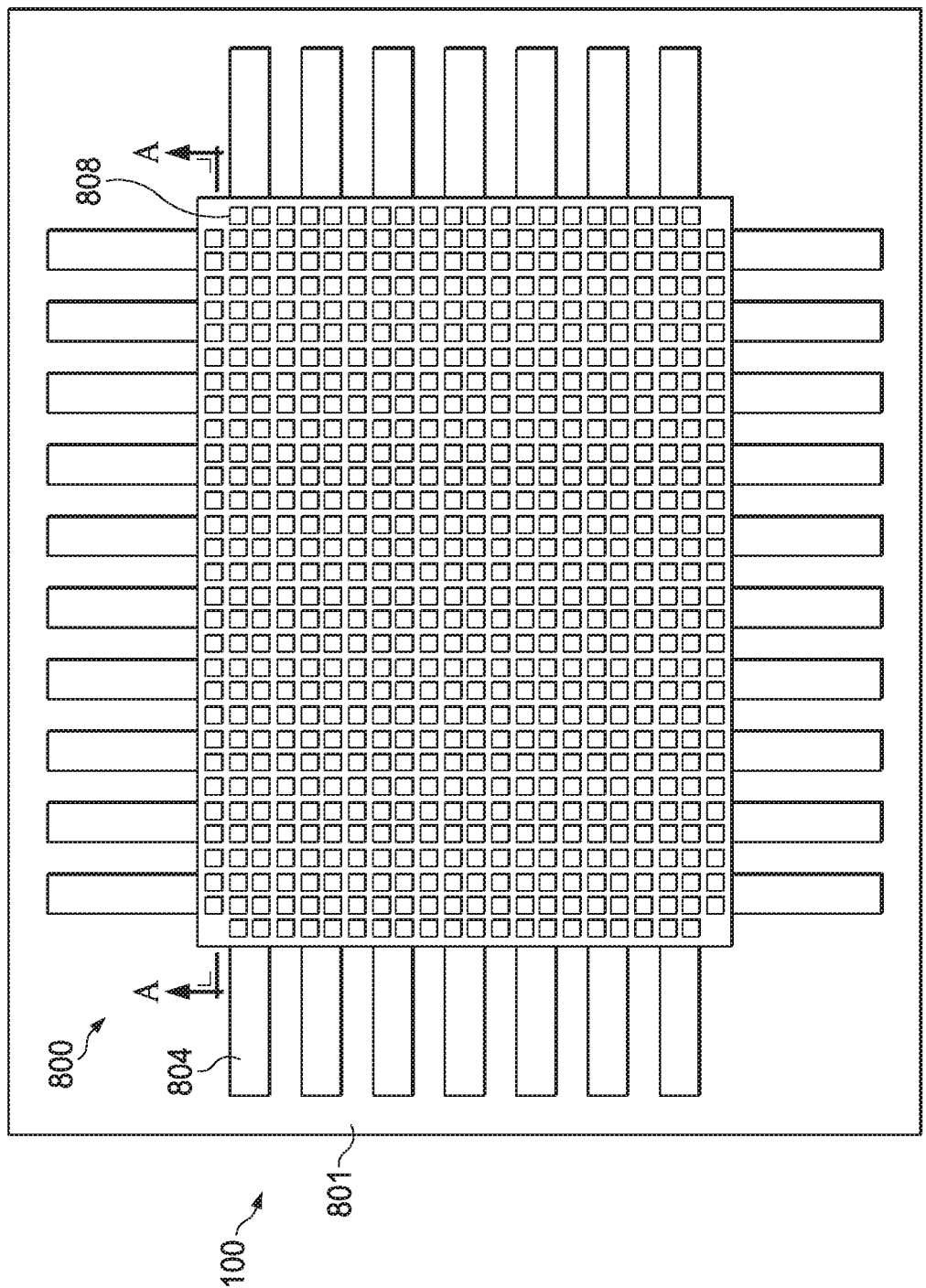
FIG. 8A presents a plan top view of an example reconfigurable integrated circuit of the disclosure.
Figure 8B:
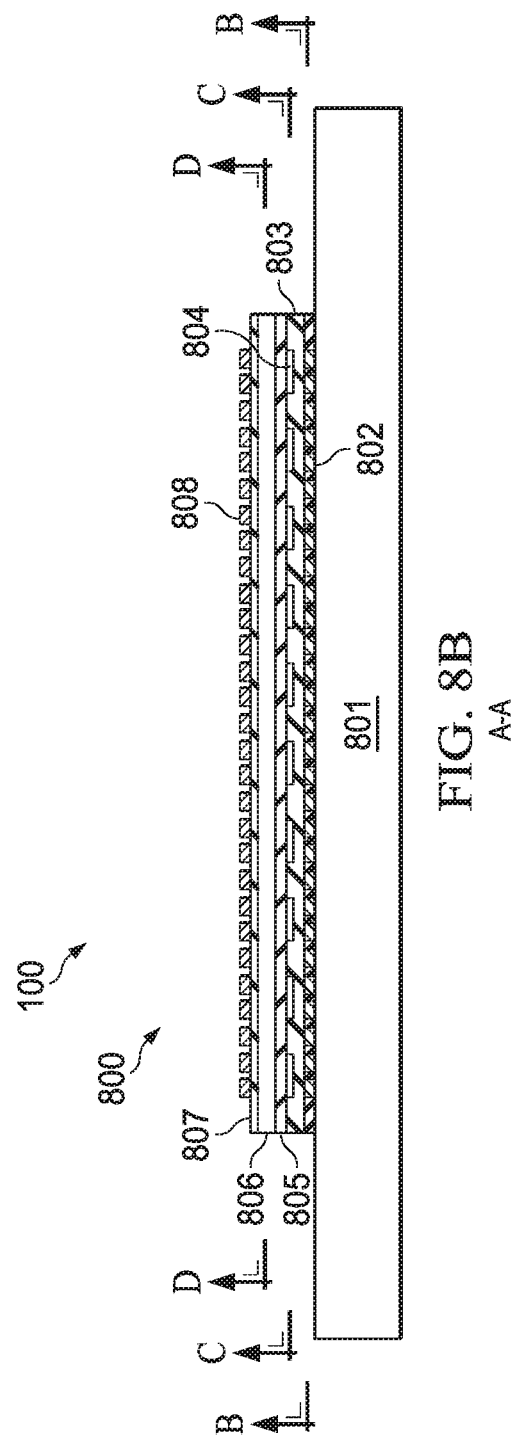
FIG. 8B presents a cross-section view of the example reconfigurable integrated circuit depicted in FIG. 8A along view line A-A shown in FIG. 8A.
Figure 9:
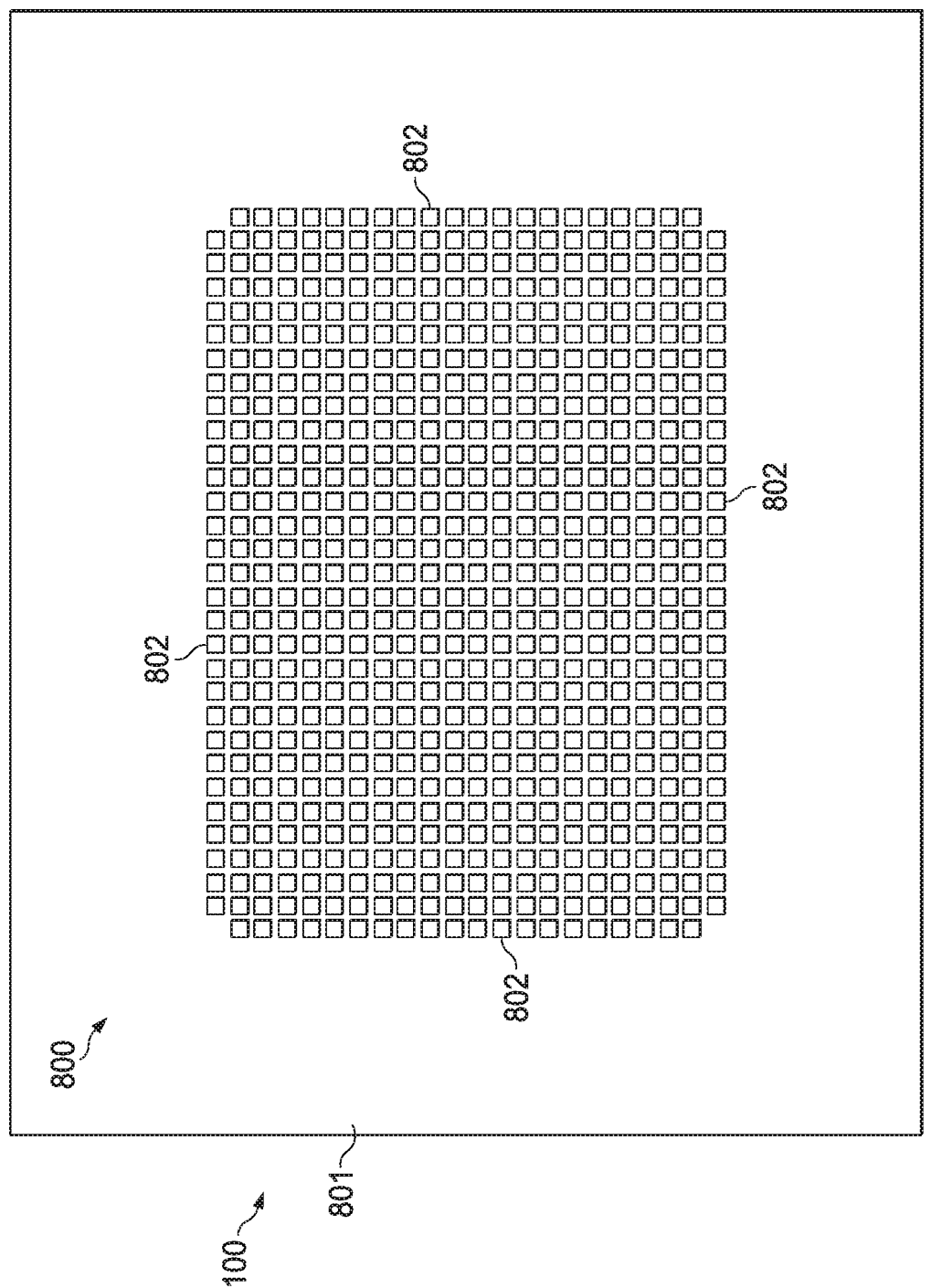
FIG. 9 presents a plan top view of the example reconfigurable integrated circuit depicted in FIG. 8B along view line B-B shown in FIG. 8B.
Figure 10:
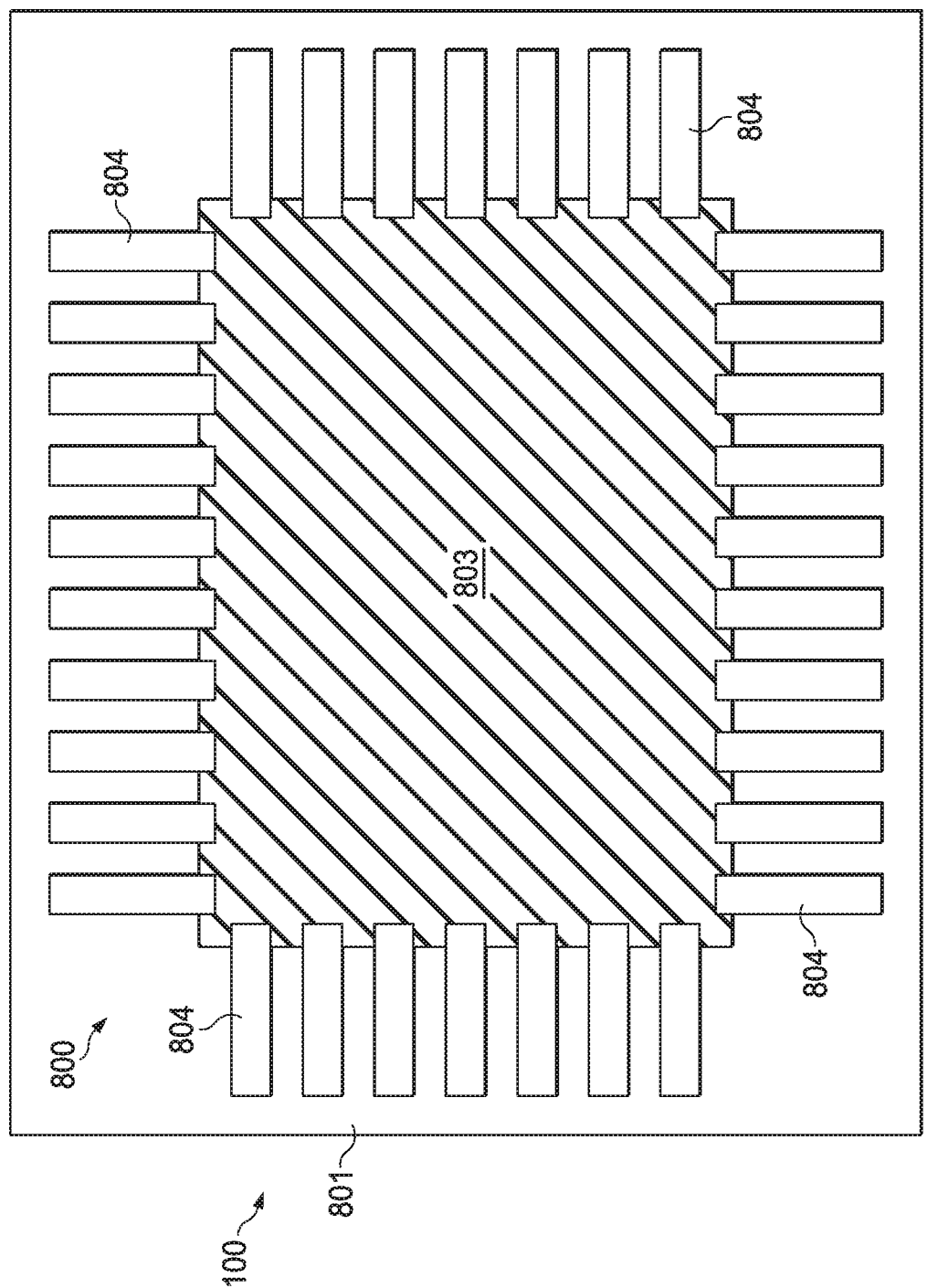
FIG. 10 presents a plan top view of the example reconfigurable integrated circuit depicted in FIG. 8B along view line C-C shown in FIG. 8B.
Figure 11:
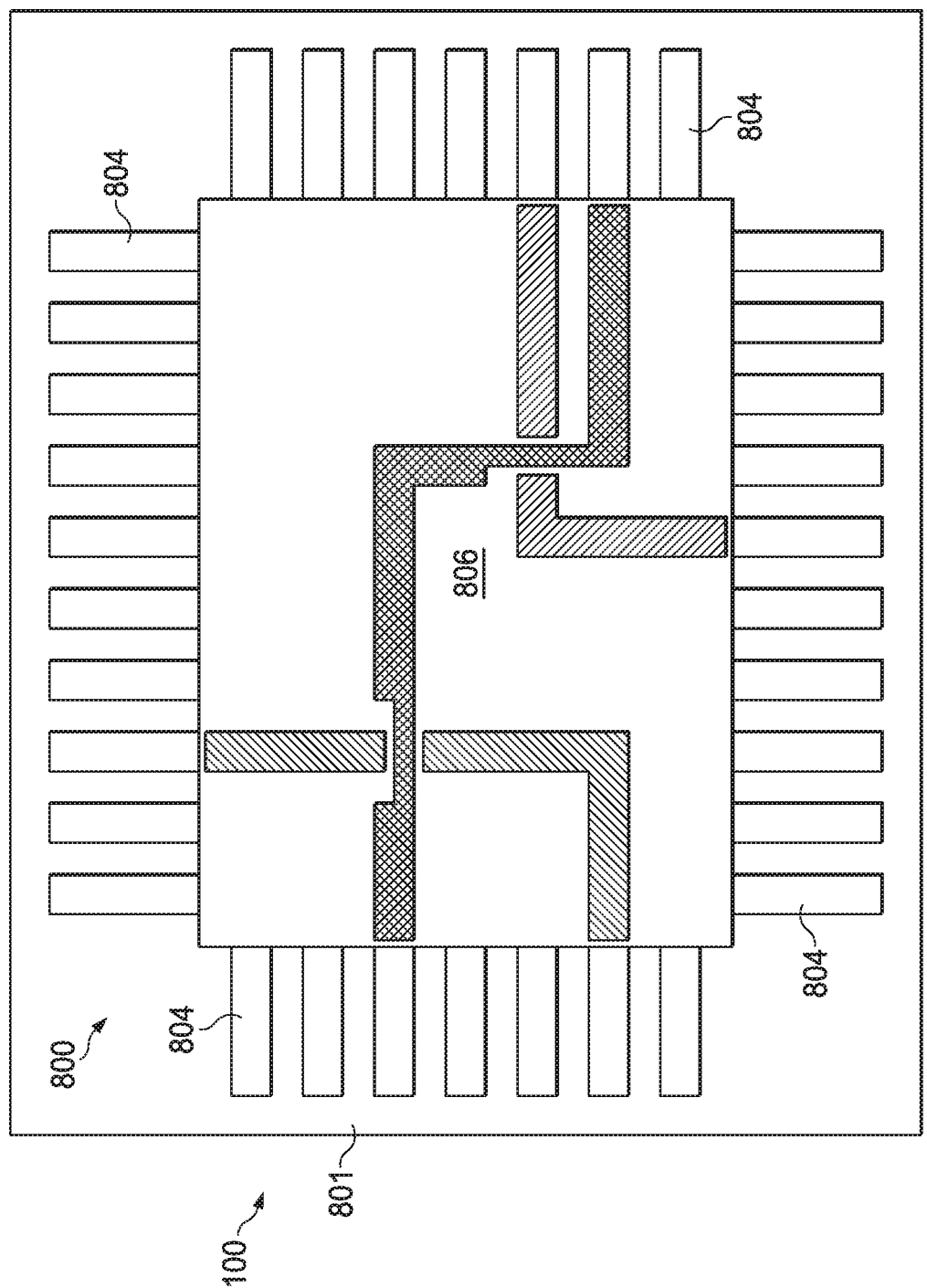
FIG. 11 presents a plan top view of the example reconfigurable integrated circuit depicted in FIG. 8B along view line D-D shown in FIG. 8B and showing conductive paths of an example IC layout defined by cells configured to have a low resistive state.

FIG. 8A presents a plan top view of an example reconfigurable integrated circuit 800 of the device 100 and FIG. 8B presents a cross-section view of the circuit 800 of the device 100 depicted in FIG. 8A, along view line A-A shown in FIG. 8A. FIG. 9 presents a plan top view of the circuit 800 of the device 100 depicted in FIG. 8B along view line B-B shown in FIG. 8B. FIG. 10 presents a plan top view of the circuit 800 of the device 100 depicted in FIG. 8B along view line C-C shown in FIG. 8B. FIG. 11 presents a plan top view of the circuit 800 of the device 100 depicted in FIG. 8B along view line D-D shown in FIG. 8B.

As illustrated in FIG. 8B, the circuit 800 can include an insulating substrate 801 and a layer of bottom electrodes 802 as further shown in FIG. 9. The circuit 800 can include a layer of contacts 804, separated from a layer of bottom electrodes 802 by an insulator layer 803 as further shown in FIG. 10. The circuit 800 can include an active film layer 806 as further shown in FIG. 11. The layer of bottom electrodes 802 can be separated from the layer of contacts 4 by an insulator layer 805. The layer of top electrodes 808 can be separated from the active film layer 806 by an insulator layer 807.

As disclosed herein, the active film layer 806 has a reversible resistive switching effect, under the influence of voltage applied between top and bottom electrodes, to form conductive paths of an example IC layout defined by cells (e.g., cells 130, 132, 134, 136 . . . , FIG. 1A) configured to have a low resistive state as further shown in FIG. 11.

Figure 12:
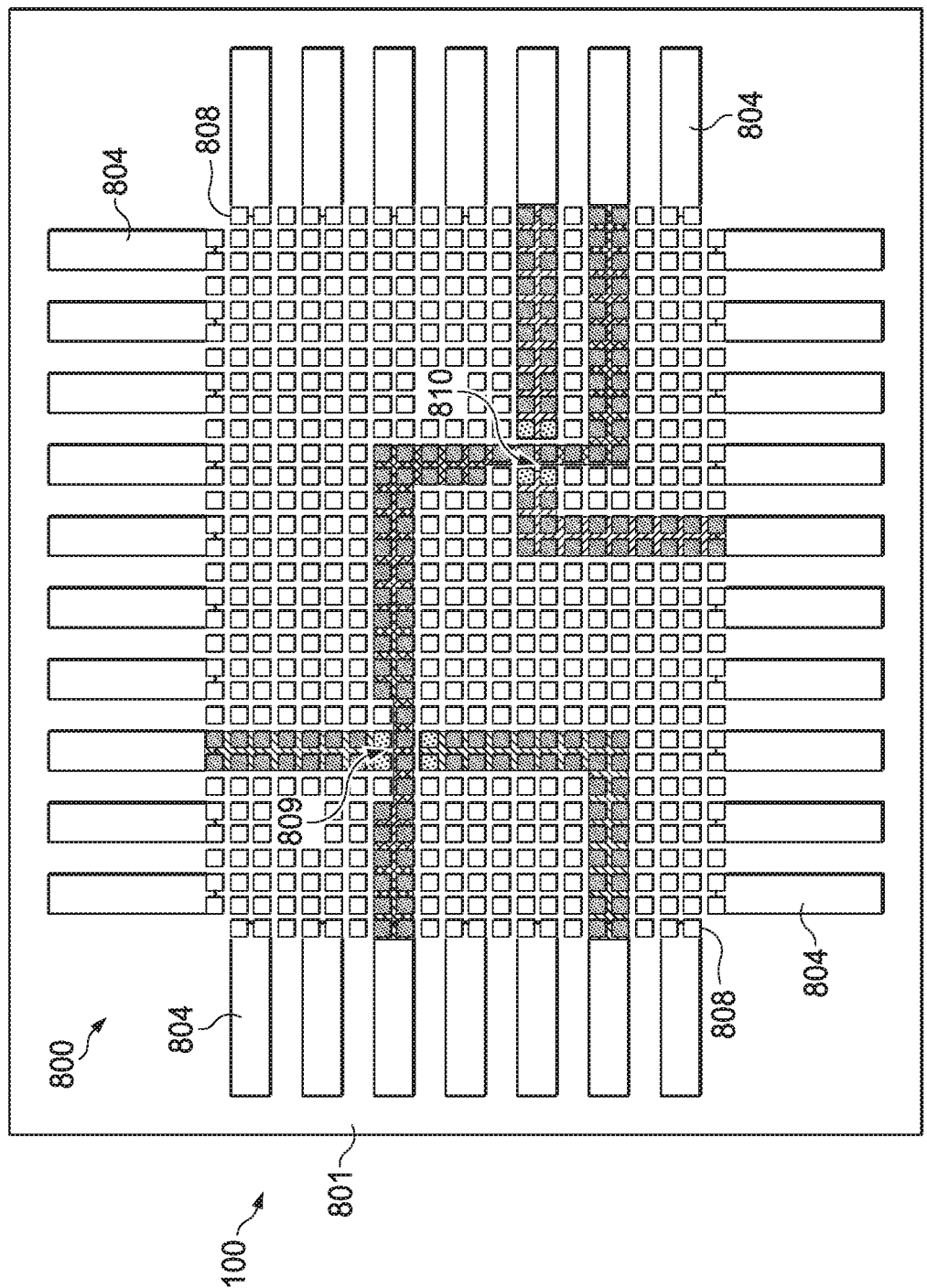
FIG. 12 presents the same plan top view of the example reconfigurable integrated circuit as shown in FIG. 11 and showing the specific cells to which voltages (e.g., $U_{HRS-LRS}$) have been applied, the cells corresponding portions of the active film layer, to locally change the resistivity of the corresponding portions of film from high to low resistivity states to define the example IC layout shown in FIG. 11.

FIG. 12 presents the same plan top view of the circuit 800 as shown in FIG. 11 and showing the specific cells to which voltages (e.g., $U_{HRS\text{-}LRS}$) have been applied, the cells corresponding portions of the active film layer, to locally change the resistivity of the corresponding portions of film from high to low resistivity states to define the conductive paths, including electron conductive channels 809, 810, of the example IC layout.

Figure 13:
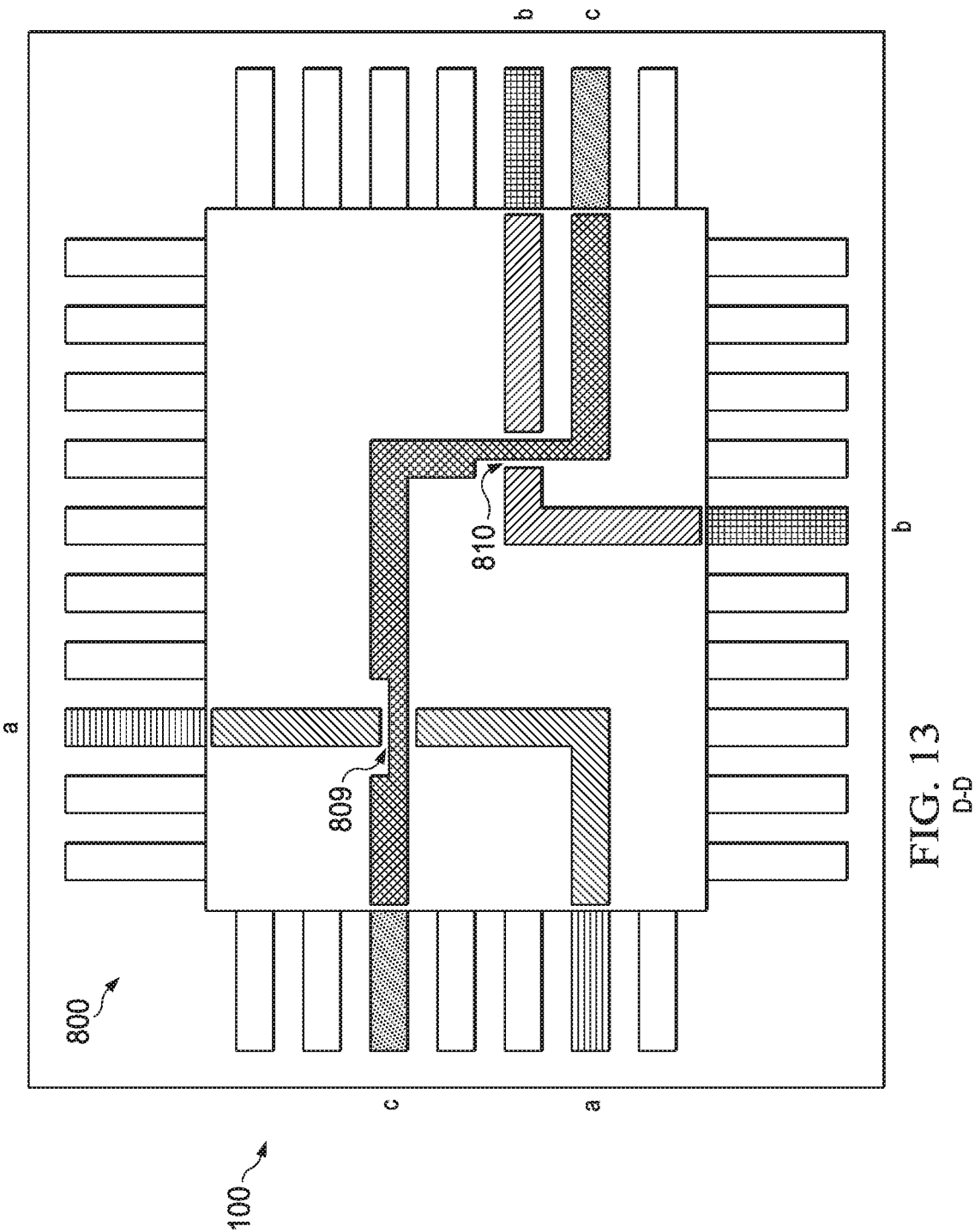
FIG. 13 presents the same plan top view of the example reconfigurable integrated circuit as shown in FIG. 12 and showing cells to which voltages have been applied via specific contacts to implement the logic function c=NOT (a OR b) in the example IC layout shown in FIG. 11.

FIG. 13 presents the same circuit 800 as shown in FIG. 12 showing cells to which voltages have been applied via specific pairs of contacts (e.g., a-a, b-b and c-c) to implement the logic function c=NOT (a OR b) in the example IC layout.

Figure 14:
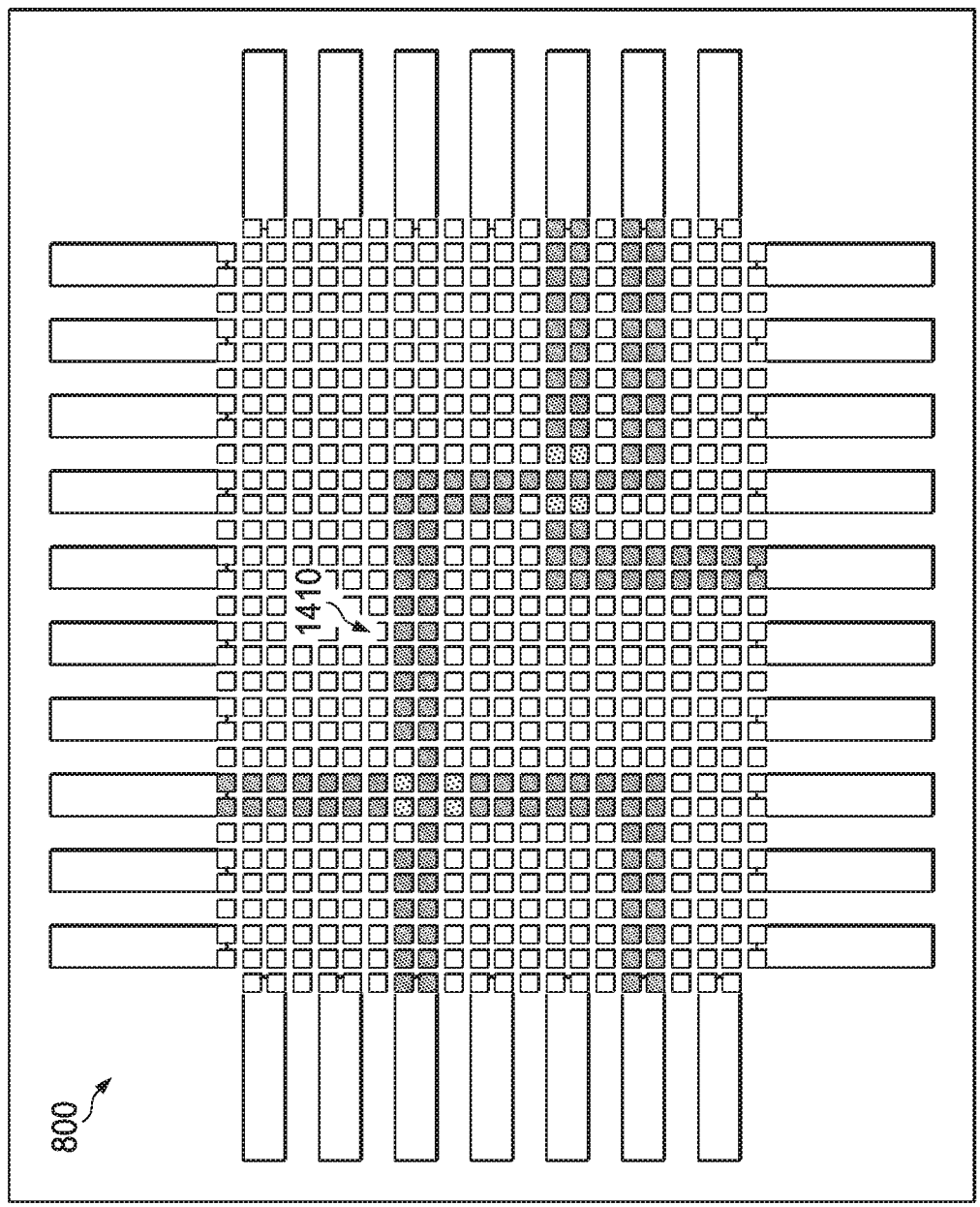
FIG. 14 presents the same plan top view of the example reconfigurable integrated circuit as shown in FIG. 13 and showing cells to which voltages have been applied specific electrode pairs to erase selected parts of the example IC layout shown in FIG. 11.

FIG. 14 presents the same circuit 800 as shown in FIG. 13 showing cells to which voltages (e.g., $U_{LRS\text{-}HRS}$) have been applied to specific electrode pairs to erase selected parts of the example IC layout, e.g., by changing the selected cells of the active film layer from low to high resistivity states to form a conductive pathway 1410.

Figure 15:
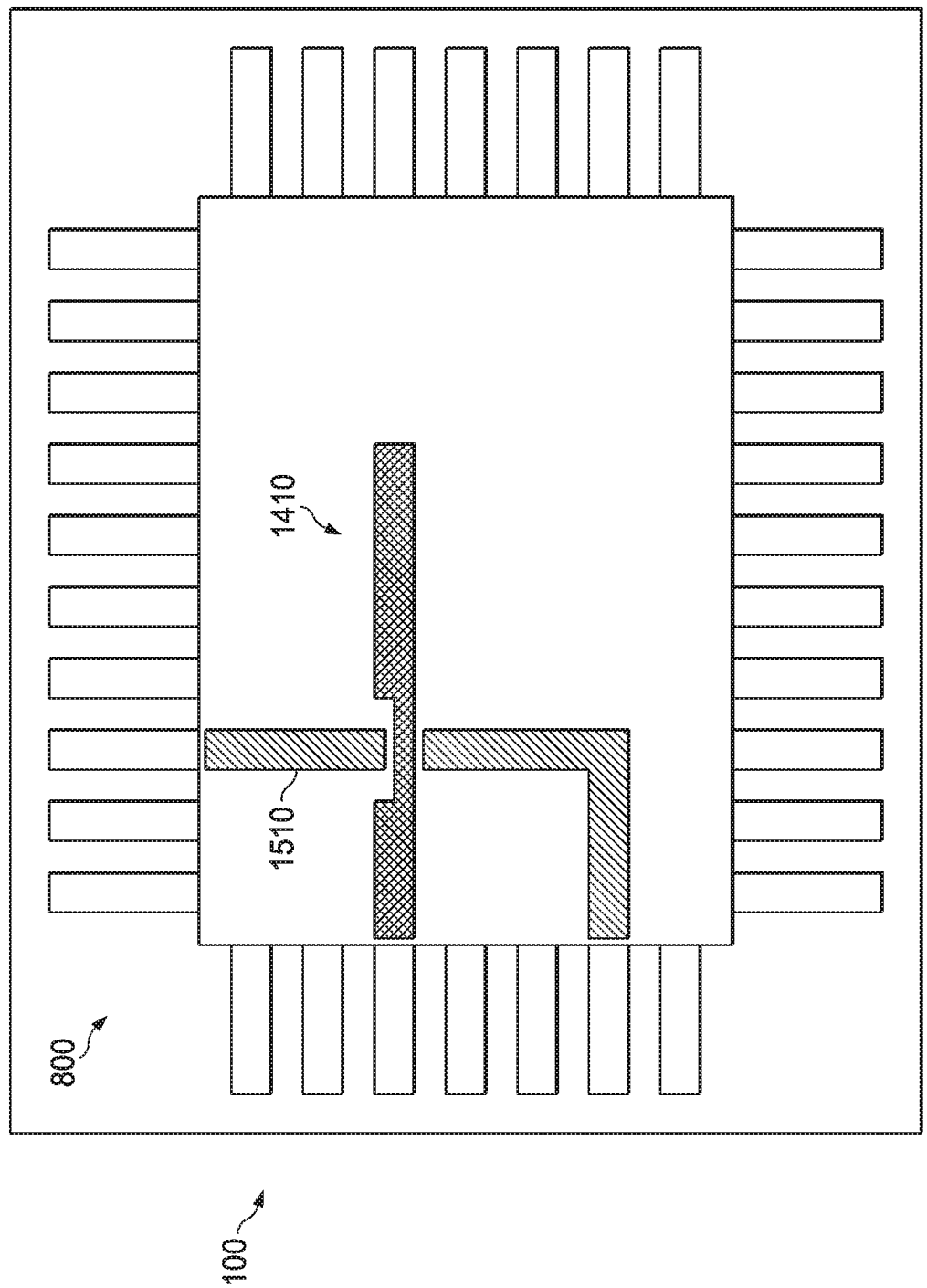
FIG. 15 presents the same plan top view of the example reconfigurable integrated circuit as shown in FIG. 14 and showing the remaining non-erased cells to which the voltage (e.g., $U_{HRS-LRS}$) had been previously applied to define the non-erased primordial part the IC layout shown in FIG. 11.

FIG. 15 presents the same plan top view of the circuit 800 as shown in FIG. 14 showing the remaining non-erased cells (e.g., cells 1510) to which the voltage (e.g., $U_{HRS\text{-}LRS}$) had been previously applied to define the non-erased primordial part of the conductive pathway 1410 of the IC layout.

Figure 16:
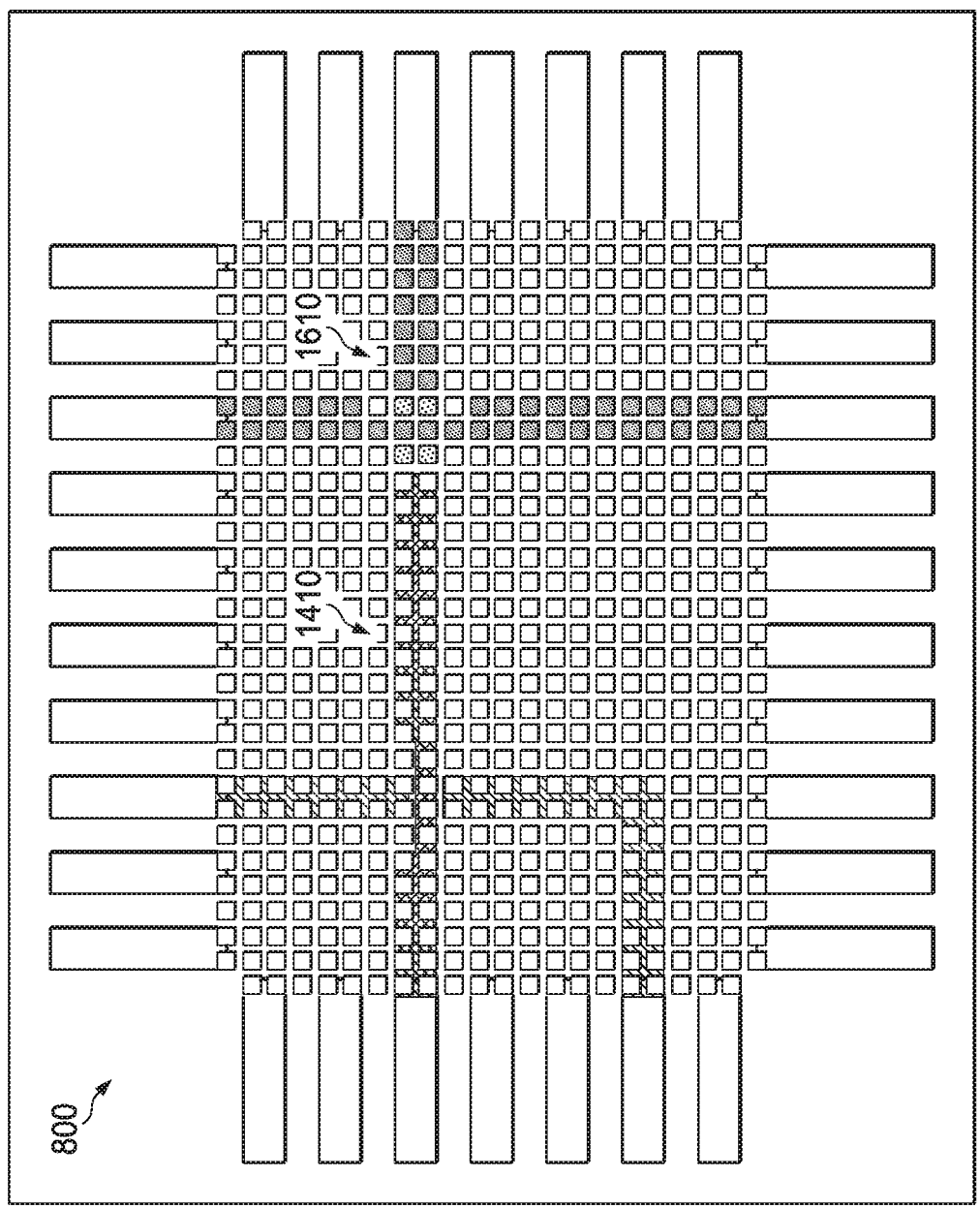
FIG. 16 presents the same plan top view of the example reconfigurable integrated circuit as shown in FIG. 15 showing additional different cells to which the voltage (e.g., $U_{HRS-LRS}$) has been applied, the cells corresponding different portions of the active film layer, to locally change the resistivity of the corresponding portions of film from high to low resistivity states to define different conductive pathways of a second example IC layout.

FIG. 16 presents the same plan top view of the example reconfigurable integrated circuit 800 as shown in FIG. 15 showing additional different cells to which the voltage (e.g., $U_{HRS\text{-}LRS}$) has been applied, the cells corresponding different portions of the active film layer, to locally change the resistivity of the corresponding portions of film from high to low resistivity states to define different conductive pathways of a second example IC layout.

Figure 17:
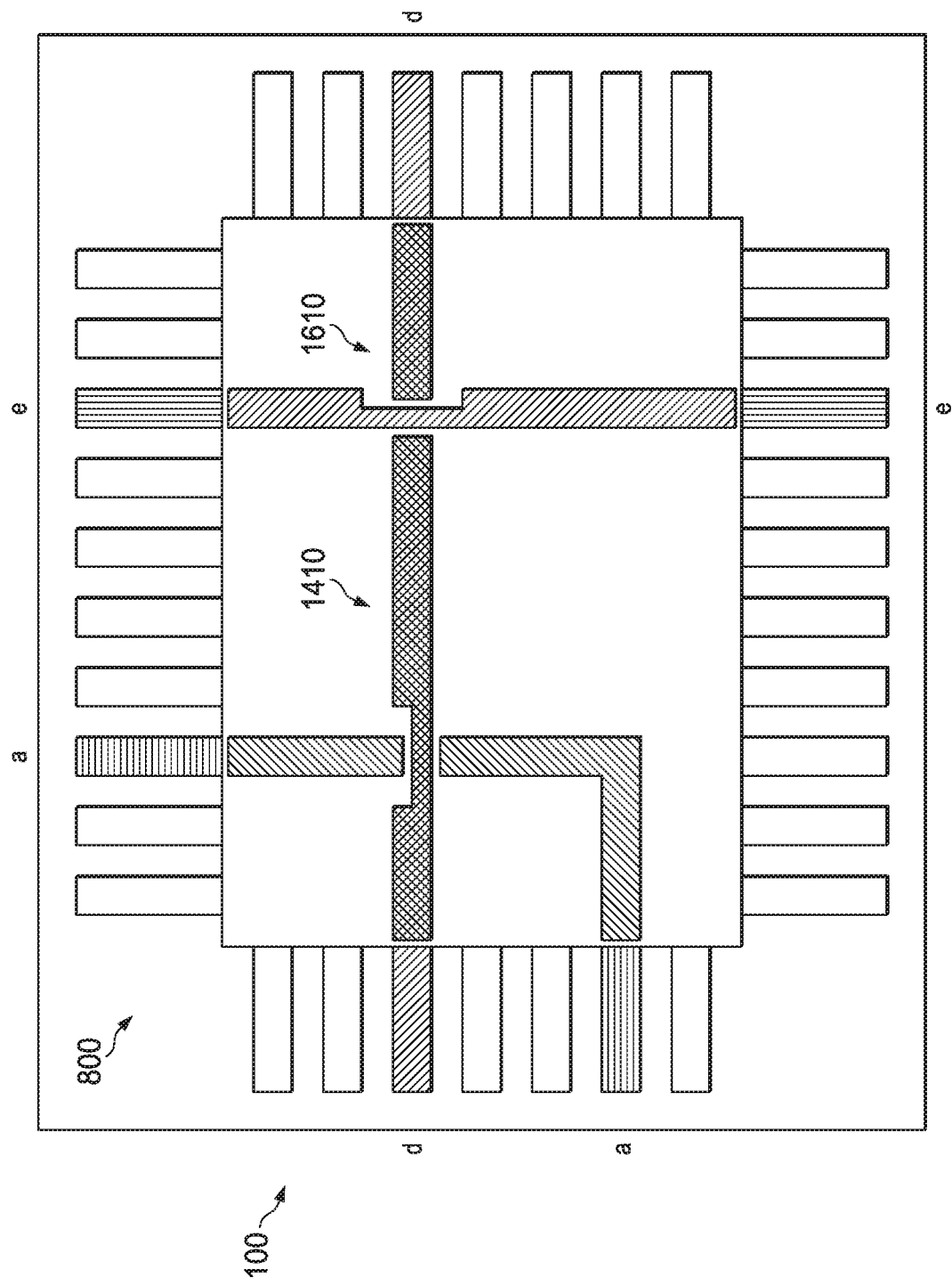
FIG. 17 presents the same plan top view of the example circuit as shown in FIG. 16 showing the cells after reconfiguration to define different conductive pathways of the second example IC layout.

FIG. 17 presents the same plan top view of the example circuit 800 as shown in FIG. 16 showing the cells after reconfiguration to define the different conductive pathways 1610 of the second example IC layout.

Figure 18:
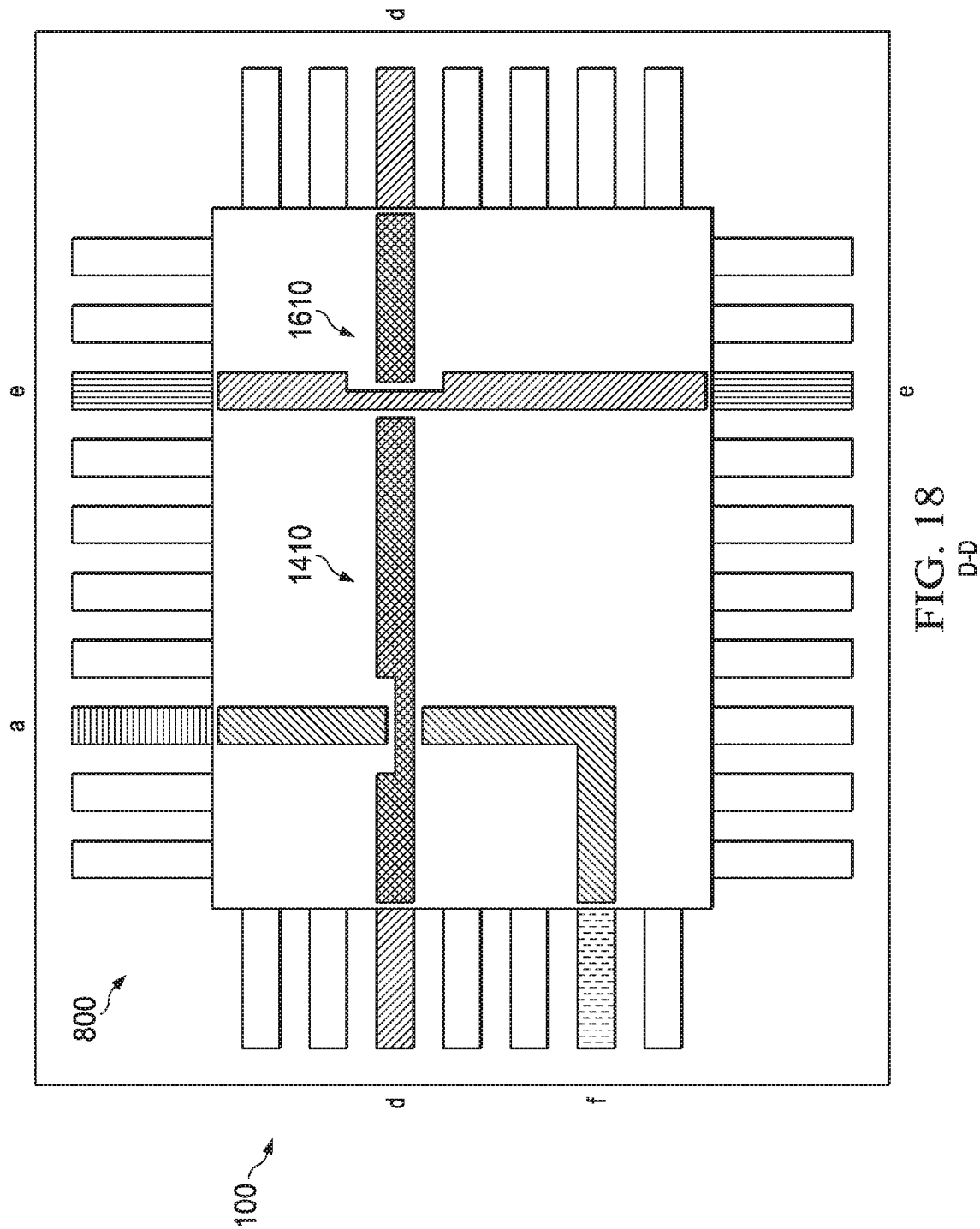
FIG. 18 presents the same plan top view of the example circuit as shown in FIG. 16 and showing cells to which voltages have been applied via specific pairs of contacts (e.g., a-a, d-d and e-e) to implement the logic function e=NOT d OR a AND d AND f in the different second example IC layout shown in FIG. 16.

FIG. 18 presents the same plan top view of the example circuit 800 as shown in FIG. 16 and showing cells to which voltages have been applied via specific pairs of contacts (e.g., a-f, d-d and e-e) to implement the logic function e=NOT d OR a AND d AND f in the different second example IC layout shown in FIG. 16.

To follow are example embodiments of the control and operation of the electrical with the reconfigurable IC 800, such as any of device disclosed in the context of FIGS. 12-18.

As disclosed in the context of FIG. 12 a target IC layout can be generated in the active film layer 6 by applying voltages (e.g., $U_{HRS\text{-}LRS\ TE\text{-}BE}$) between selected pairs of bottom electrodes 802 and top electrodes 808, to locally change the resistivity of portions of the layer 806 from insulating or HRS to conductive of LRS. This results in electrically conductive pathways, including electron conductive channels 809, 810 in the layer 806.

As a result, passive, active, and conductive elements can be formed. It should be noted that the number of contacts 804 and top electrodes 808 may be arbitrarily large depending on the complexity of target IC layout and the tasks (e.g., logic operations) the layout is designed to perform.

For instance, FIG. 13 illustrates an example implementation of the logic function c=NOT(a OR b) using the IC layout showed on FIG. 12. The truth table of the logic function c=NOT(a OR b) is shown in Table 1.

TABLE 1

The truth table of the logic function c = NOT (a OR b)

| a | b | c |
|---|---|---|
| 0 | 0 | 1 |
| 0 | 1 | 0 |
| 1 | 0 | 0 |
| 1 | 1 | 0 |

Applying voltages between the contacts a-a, it is possible to control electrical properties of an electron conductive channel 809 and correspondingly the conductivity of an electron conductive channel between contacts c-c. Similarly, applying voltage between the contacts b-b, it is possible to control electrical properties of a part of an electron conductive channel 810 and correspondingly the conductivity of an electron conductive channel 809 between contacts c-c. Thus, the voltage between the contacts c-c is a logic function depending on the voltage between the contacts a-a and the voltage between the contacts b-b.

Changing the IC layout, to perform new tasks, can occur in two stages. With continuing reference to FIG. 8B, FIG. 14 illustrates aspects of the first stage of reconfiguration of an IC layout in the active film layer 806 where voltages (e.g., $U_{LRS\text{-}HRS\ TE\text{-}BE}$) have applied between specific pairs of bottom electrodes 802 and top electrodes 808, to change the resistivity of portions of the layer 806 from conductive or LRS to insulating or HRS, thus erasing of specific parts of the first IC layout shown in FIG. 13.

With continuing reference to FIG. 8B, FIG. 15 illustrates aspects of the result of the first stage of reconfiguration of the IC layout in the layer 806 implements as described in the context of FIG. 14 whereby part of the first IC layout shown on FIG. 13 has been erased.

With continuing reference to FIG. 8B, FIG. 16 illustrates aspects of the result of the second stage of reconfiguration of the IC layout in the layer 806 by applying voltages (e.g., $U_{HRS\text{-}LRS\ TE\text{-}BE}$) between specific pairs of bottom electrodes 802 and top electrodes 808, to locally change resistivity of the portions of the layer 806 to conductive or LRS values, thereby specific additional parts of a new second IC layout.

FIG. 17 illustrates an example of implementation of the logic function e=NOT (NOT a AND d) using the second IC layout resulting from reconfiguration of the IC layout as described in the context of FIGS. 14-16. The truth table of the logic function e=NOT (NOT a AND d) is shown in Table 2.

TABLE 2

The truth table of the logic function e = NOT (NOT a AND d)

| a | d | e |
|---|---|---|
| 0 | 0 | 1 |
| 0 | 1 | 0 |
| 1 | 0 | 1 |
| 1 | 1 | 1 |

As illustrated in FIG. 18 the same second IC layout shown in FIG. 17 can alternatively implement logic function e=NOT d OR a AND d AND f if, instead applying the same signal on contacts a and f, two separate signals are applied to contacts a and f. The truth table of the logic function e=NOT d OR a AND d AND f is shown in Table 3.

TABLE 3

The truth table of the logic function
e = NOT d OR a AND d AND f

| a | d | f | e |
|---|---|---|---|
| 0 | 0 | 0 | 1 |
| 0 | 0 | 1 | 1 |
| 0 | 1 | 0 | 0 |
| 0 | 1 | 1 | 0 |
| 1 | 0 | 0 | 1 |
| 1 | 0 | 1 | 1 |
| 1 | 1 | 0 | 0 |
| 1 | 1 | 1 | 1 |

FIG. 19 presents a plan top view of an example reconfigurable integrated circuit 800 similar to that depicted in FIG. 11, the example IC layout having conductive paths (e.g., LRS areas), insulating areas (e.g., HRS areas), memory cells, vias and transistor elements. Based upon the present disclosure one skilled in the pertinent arts would appreciate how such a layout could be rapidly reconfigured to a different layout of vias and other elements.

FIG. 20 presents an electrical circuit block diagram that is electrically equivalent to the example IC layouts of the reconfigurable IC such as depicted in FIGS. 12-19.

As illustrated by these examples, the reconfigurable IC of the electrical device is capable of transforming from one configuration to another one depending on solving real-time tasks. Based on the present disclosure one skilled in the pertinent arts would understand how to form IC layouts having any number of different types of passive, active, and conductive elements as well as multiple change the number and types of logical elements and its interconnections.

The technology disclosed herein offers many advantages over the current state-of-the-art, and can be used by both integrated device manufacturers and by industries that employ any kind of electronics in their systems.

The proposed controller, integrated circuit and method of operation provide unique (e.g., instant) reconfiguration features that allow electrical devices to transform their topology. The disclosed controller and method of controlling discussed herein can be used with the various reconfigurable electrical devices and circuits employing the reconfigurable electrical devices that are also disclosed herein. Characteristics of the proposed electrical devices include: 1) contacts for signals and 2) electrodes for changing resistivity of the active layer (a thin film), which is located between them. The active layer of the device reversibly changes locally its resistivity from insulating to a conducting area when a given voltage is applied between specific pairs of top and bottom electrodes that are associated with that area. The topology of the device can be changed multiple times by changing the number and types of logical elements and interconnections.

The above-described controller, system and methods or at least a portion thereof may be embodied in or performed by various processors, such as digital data processors or computers, wherein the computers are programmed or store executable programs of sequences of software instructions to perform one or more of the steps of the methods. The software instructions of such programs may represent algorithms and be encoded in machine-executable form on non-transitory digital data storage media, e.g., magnetic or optical disks, random-access memory (RAM), magnetic hard disks, flash memories, and/or read-only memory (ROM), to enable various types of digital data processors or computers to perform one, multiple or all of the steps of one or more of the above-described methods or functions of the system described herein.

Certain embodiments disclosed herein may further relate to computer storage products with a non-transitory computer-readable medium that have program code thereon for performing various computer-implemented operations that embody at least part of the apparatuses, the systems or carry out or direct at least some of the steps of the methods set forth herein. Non-transitory medium used herein refers to all computer-readable media except for transitory, propagating signals. Examples of non-transitory computer-readable medium include, but are not limited to: magnetic media such as hard disks, floppy disks, and magnetic tape; optical media such as CD-ROM disks; magneto-optical media such as floptical disks; and hardware devices that are specially configured to store and execute program code, such as ROM and RAM devices. Examples of program code include both machine code, such as produced by a compiler, and files containing higher level code that may be executed by the computer using an interpreter.

Different embodiments described herein include a controller for a circuit of reconfigurable electrical devices, a method of reconfiguring a circuit of reconfigurable electrical devices, and a post-manufacturing, reconfigurable electrical system. The controller can includes a configuration examiner configured to receive a connection input and determine a configuration for the circuit of reconfigurable electrical devices based thereon, and a state modifier configured to modify the circuit by changing a resistance state of the reconfigurable electrical devices based on the configuration. The reconfigurable electrical devices can include paired top electrodes and bottom electrodes separated from each other by an active layer, wherein the state modifier is configured to change the resistance state by applying a voltage to at least one of the paired top and bottom electrodes. The state modifier may provide a modification output to modify the circuit, wherein the modification output includes a disabling signal that disables normal operation of at least one of the reconfigurable electrical devices, a voltage level that changes the resistance state of the at least one, and a enabling signal that enables (e.g., re-enables) operation of the at least one reconfigurable electrical device.

The method may include receiving a configuration for the circuit, disabling normal operation of reconfigurable electrical devices of the circuit to be reconfigured based on the configuration, setting a resistance state of the reconfigurable electrical devices corresponding to the configuration, and enabling normal operation of the reconfigurable electrical devices after the setting.

The post-manufacturing, reconfigurable electrical system may include a circuit having multiple contacts and reconfigurable electrical devices that are coupled to the multiple contacts and a controller that includes an interface configured to receive a connection input that indicates connection paths between some of the contacts, and a processor configured to determine a configuration of the reconfigurable electrical devices that corresponds to the connection paths, and modify a resistance state of at least some of the reconfigurable electrical devices to provide the connection paths.

Although the present disclosure has been described in detail, those skilled in the art should understand that they can make various changes, substitutions and alterations herein without departing from the scope of the invention.

What is claimed is:

1. An electrical system, comprising:
a circuit of reconfigurable electrical devices; and
a controller including a processor having a configuration examiner and a state modifier, wherein the configuration examiner is configured to:
determine a configuration for the circuit of reconfigurable electrical devices based upon a connection input, and wherein
the state modifier is configured to modify, based on the determined configuration, the circuit by changing a resistance state of at least one electrical device of the reconfigurable electrical devices, wherein the state modifier modifies the circuit by applying a modification output to at least one paired top electrode and bottom electrode of at least one respective reconfigurable electrical device of the reconfigurable electrical devices, said modification output including a disabling signal that disables an operation of the at least one respective reconfigurable electrical device of the reconfigurable electrical devices.

2. The system of claim 1, wherein the connection input is derived from a brain-like devices, an intelligent system or multi-purpose chip or a combination thereof.

3. The system of claim 1, wherein the state modifier is configured to change the resistance state of the reconfigurable electrical devices by applying a voltage to at least one paired top electrode and bottom electrode of the reconfigurable electrical devices, the at least one paired top electrode and bottom electrode being separated from each other by an active layer of the reconfigurable electrical devices.

4. The system of claim 1, wherein the state modifier modifies the circuit by providing a modification output applied at least one paired top electrode and bottom electrode of the reconfigurable electrical devices that includes a voltage level that changes the resistance state of the at least one paired top electrode and bottom electrode.

5. The system of claim 1, wherein the processor is configured to modify the circuit while the circuit is in a non-operating reconfiguration state.

6. The system of claim 1, wherein the disabling signal interrupts an operating voltage applied to the circuit.

7. The system of claim 1, wherein the state modifier modifies the circuit by providing a modification output applied to at least one paired top electrode and bottom electrode of the reconfigurable electrical devices that includes an enabling signal that enables operation of the at least one paired top electrode and bottom electrode.

8. The system of claim 7, wherein the enabling signal applies an operating voltage applied to at least one paired top electrode and bottom electrode of the reconfigurable electrical devices.

9. A controller for reconfigurable electrical devices, comprising:
an interface configured to receive configuration information; and
a processor configured to determine a circuit configuration for a circuit of the reconfigurable electrical devices and modify the circuit by changing a resistance state of at least one electrical device of the reconfigurable electrical devices based on the determined configuration, wherein the resistance state of a plurality of the reconfigurable electrical devices is set by reversibly changing a local area of an active layer of the plurality of reconfigurable electrical devices between insulating and conducting by applying a voltage between one or more pairs of top and bottom electrodes of the plurality of the reconfigurable electrical devices that are associated with the local area.

10. The controller of claim 9, wherein the configuration information includes connection input to define electrical conductive paths in the circuit corresponding to a logic function.

11. The controller of claim 9, further including a memory, the memory configured to store operating instructions with the configuration information to direct the operation of the processor.

12. The controller of claim 11, wherein the memory or at least a portion thereof is a non-volatile memory.

13. The controller of claim 11, wherein the memory is part of the processor.

14. The controller of claim 11, wherein the operating instructions include one or more algorithms to implement a method that includes:
receiving from the memory of the controller the configuration for the circuit,
sending a disabling signal to at least one of the reconfigurable electrical devices to disable an operating state of the reconfigurable electrical device,
sending a setting signal to the at least one of the reconfigurable electrical device to set the resistance state of the reconfigurable electrical device, and
sending an enabling signal to the reconfigurable electrical device to enable the operating state of the reconfigurable electrical device with the resistance state from the setting signal.

15. The controller of claim 9, wherein the processor is configured to modify a portion of the circuit while a remaining portion of the circuit is in a normal operating state.

16. The controller device of claim 9, wherein the processor is configured to fully modify the circuit while the circuit is in a non-operating reconfiguration state.

17. A method of controlling reconfigurable electrical devices of a circuit, comprising:
sending a disabling signal to at least one of the reconfigurable electrical devices to disable an operating state of the reconfigurable electrical device;
sending a setting signal to the at least one reconfigurable electrical device to set a resistance state of the reconfigurable electrical device;
sending an enabling signal to the at least one reconfigurable electrical device to enable the operating state of the reconfigurable electrical device with the resistance state from the setting signal, wherein the resistance state of a plurality of the reconfigurable electrical devices is set by reversibly changing a local area of an active layer of the plurality of reconfigurable electrical devices between insulating and conducting by applying a voltage between one or more pairs of top and bottom electrodes of the plurality of the reconfigurable electrical devices that are associated with the local area.

18. The method of claim 17, wherein the enabling signal causes the application of a designated voltage level to a pair or pairs of electrodes to set the resistance state of the at least one reconfigurable electrical device.

19. The method of claim 17, wherein the circuit is configured to be modifiable while the circuit is in a non-operating reconfiguration state.

* * * * *